(12) United States Patent
Hashimoto et al.

(10) Patent No.: US 7,495,322 B2
(45) Date of Patent: Feb. 24, 2009

(54) LIGHT-EMITTING DEVICE

(75) Inventors: Takuma Hashimoto, Yawata (JP); Masaru Sugimoto, Osaka (JP); Ryoji Yokotani, Hirakata (JP); Koji Nishioka, Kadoma (JP); Yutaka Iwahori, Kadoma (JP); Shinya Ishizaki, Hirakata (JP); Toshiyuki Suzuki, Nara (JP); Yoshiyuki Uchinono, Hirakata (JP); Masahide Muto, Kobe (JP); Satoshi Mori, Osaka (JP); Hideyoshi Kimura, Hirakata (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 164 days.

(21) Appl. No.: 10/558,360

(22) PCT Filed: May 26, 2004

(86) PCT No.: PCT/JP2004/007535
§ 371 (c)(1),
(2), (4) Date: Nov. 25, 2005

(87) PCT Pub. No.: WO2004/105142
PCT Pub. Date: Dec. 2, 2004

(65) Prior Publication Data
US 2007/0007540 A1   Jan. 11, 2007

(30) Foreign Application Priority Data
May 26, 2003 (JP) .............................. 2003-148050
Aug. 21, 2003 (JP) .............................. 2003-298007
Nov. 25, 2003 (JP) .............................. 2003-394451

(51) Int. Cl.
H01L 21/00   (2006.01)
H01L 23/495  (2006.01)
F21V 29/00   (2006.01)
H05K 1/11    (2006.01)
H05K 5/02    (2006.01)
H05K 7/18    (2006.01)

(52) U.S. Cl. ............................ 257/676; 257/79; 257/81; 257/82; 257/95; 257/99; 257/774; 361/794; 361/813; 362/241; 362/294; 362/555; 438/25

(58) Field of Classification Search ............ 257/79–103, 257/676, 774; 361/414, 794, 813; 362/241, 362/294, 555; 438/22–47
See application file for complete search history.

(56) References Cited

U.S. PATENT DOCUMENTS 5,172,301 A * 12/1992 Schneider ................... 361/717

(Continued)

FOREIGN PATENT DOCUMENTS

EP          0836227          4/1998

(Continued)

OTHER PUBLICATIONS

English Language Abstract of JP 2001-134558.

(Continued)

*Primary Examiner*—Andy Huynh
*Assistant Examiner*—Arman Khosraviani
(74) *Attorney, Agent, or Firm*—Greenblum & Bernstein, P.L.C.

(57) ABSTRACT

A light-emitting device (200) has a submount (100) and a plate for heat transfer (300) having a metallic plate (30). The submount (100) has a mount base (10), at least one light-emitting diode chip (5) mounted thereon and electrically conducting lines (12-17) formed on the mount base (10) to be connected electrically to the light-emitting diode chip (5). A first plane (11) of the mount base (10) of the submount (100) is bonded thermally to the first plate (300). For example, the plate is a circuit board having a metallic plate (30), and the submount (100) is bonded thermally to the metallic plate (30) of the one of the at least one plate (300). In an example, a second plate for heat transfer is also bonded thermally to a second plane of the mount base (100) for providing a plurality of heat transfer paths.

3 Claims, 29 Drawing Sheets

U.S. PATENT DOCUMENTS

| | | | |
|---|---|---|---|
| 5,311,407 A * | 5/1994 | Lumbard | 361/813 |
| 5,323,084 A * | 6/1994 | Haitz | 313/500 |
| 5,825,625 A | 10/1998 | Esterberg et al. | |
| 6,159,764 A | 12/2000 | Kinsman et al. | |
| 6,318,886 B1 * | 11/2001 | Stopa et al. | 362/555 |
| 6,335,548 B1 * | 1/2002 | Roberts et al. | 257/98 |
| 6,498,355 B1 * | 12/2002 | Harrah et al. | 257/99 |
| 6,501,103 B1 | 12/2002 | Jory et al. | |
| 6,506,629 B1 | 1/2003 | Kinsman et al. | |
| 6,562,643 B2 | 5/2003 | Chen | |
| 6,706,546 B2 * | 3/2004 | Inao et al. | 438/31 |
| 6,784,530 B2 * | 8/2004 | Sugaya et al. | 257/686 |
| 6,874,910 B2 | 4/2005 | Sugimoto et al. | |
| 6,885,563 B2 * | 4/2005 | Panella et al. | 361/794 |
| 6,930,332 B2 | 8/2005 | Hashimoto et al. | |
| 6,936,855 B1 * | 8/2005 | Harrah | 257/88 |
| 2001/0030866 A1 | 10/2001 | Hochstein | |
| 2001/0050370 A1 * | 12/2001 | Sakamoto et al. | 257/79 |
| 2001/0052600 A1 * | 12/2001 | Sakamoto et al. | 257/79 |
| 2002/0004251 A1 * | 1/2002 | Roberts et al. | 438/26 |
| 2003/0022407 A1 * | 1/2003 | Sakamoto et al. | 438/22 |
| 2003/0170922 A1 * | 9/2003 | Sakamoto et al. | 438/22 |
| 2003/0189830 A1 * | 10/2003 | Sugimoto et al. | 362/294 |
| 2004/0012958 A1 | 1/2004 | Hashimoto et al. | |
| 2004/0190304 A1 | 9/2004 | Sugimoto et al. | |

FOREIGN PATENT DOCUMENTS

| | | |
|---|---|---|
| EP | 1139439 | 10/2001 |
| JP | 58-201383 | 11/1983 |
| JP | 4-048740 | 2/1992 |
| JP | 2001-134558 | 5/2001 |
| JP | 2002-162626 | 6/2002 |
| WO | WO 02084750 A1 * | 10/2002 |

OTHER PUBLICATIONS

English Language Abstract of JP 2002-162626.
English Language Abstract of JP 58-201383.
English Language Abstract of JP 4-048740.

* cited by examiner

LIGHT-EMITTING DEVICE

TECHNICAL FIELD

The invention relates to a light-emitting device having a light-emitting diode, and in particular to a light-emitting device having good heat transfer.

BACKGROUND ART

Recently, by combining a light-emitting diode (LED) chip for radiating blue or ultraviolet rays based on a gallium nitride semiconductor with a fluorescent material of various types, a light-emitting device which emits a light of a color or colors, including white, different from that of the emitting light of the LED chip has been developed. The light-emitting device has advantages such as small size, light weight and low dissipating power, and it is used widely for a light source for display, a light source in substitution of a small electric bulb, a light source for a liquid crystal display, and the like. When such a light-emitting device is used for a light source for display, a light source for liquid crystal panel or the like, the brightness per chip is low and insufficient. Then an LED package is provided to have an LED chip mounted and sealed on a mount base having electrically conducting portions to be connected to an external circuit, and a required number of LED packages are generally mounted on a print circuit board. For example, Japanese Patent laid open Publication 2001-134558 discloses a light-emitting device wherein a metallic bloc having a light-emitting diode chip in a recess thereof is mounted on a metallic flat plate.

In order to provide a high light intensity, an injection current for an LED chip may be increased. Because an LED chip available now has efficiency as small as 10%, a large part of input electric energy is converted to heat, so that the amount of heat increases with increasing current. It is known that characteristics such as life and efficiency of LED chip are deteriorated when the temperature rises due to the generated heat. Because the print circuit board for mounting the LED package is generally made of a resin such as polyimide or epoxy resin having low thermal conductivity, the generated heat cannot be radiated efficiently from the LED package.

FIG. 1 shows an example of a prior art light-emitting device 99 which efficiently transfers the heat generated in LED packages (for example, Japanese Patent laid open Publication 2002-162626). Each of the LED packages 90 having a pair of external terminals 95 of so-called plane mount type is mounted on a film base 92 which is a print circuit board made of polyimide. Lands 93 of electrically conducting patterns are formed on a top plane of the film base 92, while the back plane thereof is bonded with an adhesive to a supporting frame 91 made of a metal. The electrodes 95 of the LED packages 90 are connected to the lands 93. Further, holes are formed vertically through the film base 92 and the frame 91 at regions below the LED packages 90, and an adhesive filler 94 having high thermal conductivity is filled into the holes to the back of the LED packages 90. A part of the heat generated by the LED chips conducts via the lands 93 to the film base 92 and further to the frame 91 to be radiated therefrom. Further, a large part of the heat generated in the LED package conducts directly through the adhesive filler to the film base 92 and further to the frame 91 to be radiated therefrom.

However, the above-mentioned heat transfer structure of a light emitting device has the following problems. The adhesive filler made mainly of silicone resin and having high thermal conductivity is used to conduct the heat generated in the LED chip, but it has a smaller thermal conductivity than a material such as a metal or a ceramic. Further, at least a step for filling the filler into the holes for forming heat transfer paths is needed in a packaging process thereof, besides a step for mounting the LED packages 90 to the lands 93. Further, the filling step is troublesome.

DISCLOSURE OF INVENTION

An object of the invention is to provide a light-emitting device with an LED chip having a simple structure to improve heat transfer.

In one aspect of the invention, a light-emitting device comprises a submount and a first plate for heat transfer comprising a metallic plate. The submount comprises a mount base, at least one light-emitting diode chip mounted thereon and electrically conducting lines formed on the mount base to be connected electrically to the light-emitting diode chip. A first plane of the mount base opposed to the metallic plate of the first plate is bonded thermally to said first plate for heat transfer. The heat transfer means heat conduction through the solid materials between the submount and the first plate for heat transfer. The thermal connection includes contact between two planes or bonding thereof with solder or the like.

Preferably, the first plate for heat transfer comprises the metallic plate, an insulator layer formed thereon, and an electrical connection pattern layer formed on the insulator layer. The first plane of the mount base of the submount is bonded thermally to a portion of the metallic plate of the first plate exposed at a side opposed to the submount by removing the insulator layer and the pattern layer. The electrically conducting lines of the submount are connected electrically to the electrical connection pattern layer of the first plate. The heat generated in the chip can be transferred to the metallic plate.

Preferably, at least one of the mount base and the first plate has a protrusion having a plane to bond thermally to the other of the mount base and the first plate. Thus, the mount base can be bonded directly to the first plate.

Preferably, one of the mount base and the first plate has a protrusion while the other has a recess, so that the protrusion fits into the recess to bond thermally between them.

Preferably, the light-emitting diode chip is mounted face down to the mount base with a bonding material.

Preferably, the mount base comprises throughholes covered by a layer made of a material having a higher thermal conductivity than the mount base. For example, the throughholes are filled with a material having a higher thermal conductivity than the mount base.

Preferably, the light-emitting device further comprises a metallic member provided between the mount base and the first plate for heat transfer. The metallic member bonding thermally with the mount base of the submount and with the exposed portion of the metallic plate of the first plate. For example, the metallic member is a bonding member to bond the mount base of the submount to the exposed portion of the metallic plate of the first plate.

Preferably, the mount base is made of a ceramic material. Thus, the heat can be transferred more efficiently than the mount base fabricated with resin.

In a different aspect of the invention, a light-emitting device further comprises at least one groove on the first plane of the mount base. Preferably, each of the at least one groove comprises a bottom and two sides, a width between the two sides increasing in a direction from the bottom toward an opening of the each of the at least one groove.

Preferably, the light-emitting device further comprises a layer formed on the at least one groove formed with a material having a thermal conductivity higher than the mount base.

Preferably, the light-emitting diode chip is mounted face down to the mount base with a bonding material, and the at least one groove is formed between the bonding material and the first plane of the mount base to bond thermally to the exposed portion of the metallic plate.

Preferably, there are provided two or more grooves, and the density of the grooves is increased toward a region just below the light-emitting diode chip.

Preferably, a number of the at least one groove is equal to or larger than two, and the grooves have different depths. The depth of the grooves is increased toward a region just below the light-emitting diode chip.

Preferably, a number of the at least one groove is equal to or larger than two, and density of the grooves is increased toward a region just below the bonding material.

Preferably, a number of the at least one groove is equal to or larger than two, and the grooves have different depths. Depth of the grooves is increased toward a region just below the bonding material.

Preferably, a number of the at least one groove is equal to or larger than two, and the grooves have different depths. A number of the at least one groove is equal to or larger than two, and density of the grooves is increased toward a region just below a central light-emitting diode chip in the light-emitting diode chips.

Preferably, a number of the at least one light-emitting diode chip is equal to or larger than two, a number of the at least one groove is equal to or larger than two, the grooves have different depths, and the grooves have deeper depth in a region between a central light-emitting chip among the at least one light-emitting diode chip and the exposed portion of the metallic plate than in the other regions.

In another aspect of the invention, the light-emitting device further comprises a second plate for heat transfer bonded thermally to a second plane of the submount different from the first plane thereof besides the first plate for heat transfer. Thus the heat generated in the light-emitting diode chip can be transferred in two ways through the first and second plates. The heat transfer means heat conduction through the solid materials between the submount and the first or second plate for heat transfer.

Preferably, the second plate for heat transfer comprises another metallic plate, an insulator layer formed thereon, and an electrical connection pattern layer formed on the insulator layer. The electrical connection pattern layer is connected electrically to the electrically conducting lines of the submount. If mount base of the submount is bonded directly to the metallic plate, the heat is transferred to the second plate becomes more efficiently.

Preferably, one of the first and second plates comprises at least one plate member to bond thermally with the other of the first and second plates.

Preferably, the light-emitting device further comprises a thermally conducting member provided between the first and second plates to bond thermally with each of the first and second plates.

Preferably, one of the first and second planes has an opening above the at least one light-emitting diode chip mounted on the mount base.

Preferably, the mount base includes a heat transfer material embedded therein, the heat transfer material having thermal conductivity higher than a main body of the mount base. For example, the heat transfer member is bonded with at least one of the first and second plates.

It is an advantage of the invention that the heat generated in the light-emitting diode chip can be transferred easily through the thermal bonding from the submount to the first plate bonded thermally thereto.

It is another advantage of the invention that the temperature rise of the light-emitting diode chip can be decreased due to the efficient thermal transfer.

It is a further advantage of the invention that the heat generated in the light-emitting diode chip can be transferred more efficiently through a plurality of heat transfer paths to decrease the temperature of the light-emitting diode chip.

BEST MODE FOR CARRYING OUT THE INVENTION

Figure 1:
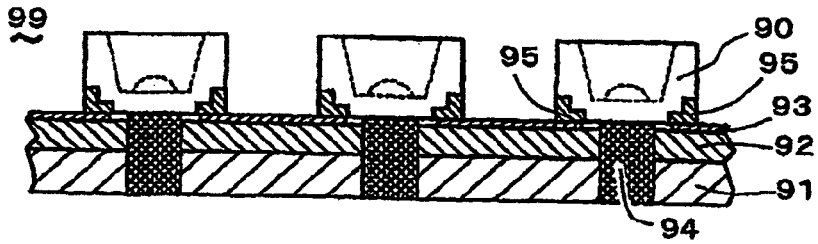
FIG. 1 is a sectional view of a prior art light-emitting device.

Light-emitting devices of several embodiments of the invention are explained below with reference to the appended drawings, wherein like reference characters designate like or corresponding parts throughout the several views.

Figure 2:
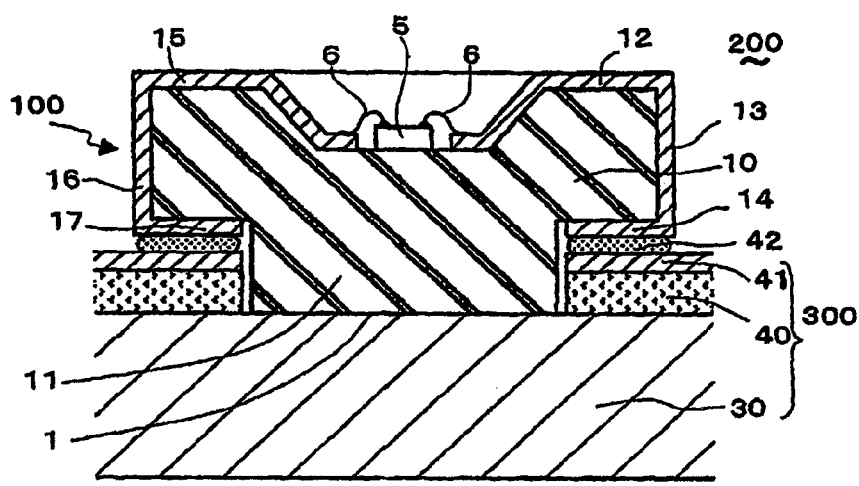
FIG. 2 is a sectional view of a light-emitting device of an embodiment of the invention.

FIG. 2 shows a light-emitting device 200 of an embodiment of the invention. In the light-emitting device 200, a bottom 11 of a submount 100 for LED contacts thermally with a metallic plate 30 of a circuit board 300. The submount 100 has a mount base 10 having electrically conducting lines 12-14 and 13-17 and a light-emitting diode (LED) chip 5 mounted on the mount base 10. The LED chip 5 emits a beam in a direction perpendicular to the sheet of paper on which FIG. 2 is illustrated. The circuit board 300 has the metallic plate 30 and a metallic pattern 41 for electrical conduction formed on an electrically insulating layer 40. The LED chip 5 has a gallium nitride semiconductor. In this and following embodiments, the LED chip 5 has a gallium nitride semiconductor, but not limited thereto.

The submount 100 has the mount base 10 having a recess like a cup for mounting the LED chip 5 on the center thereof. It has a step to form a protrusion 11 formed at the bottom side thereof and extending in the down direction, and this provides a T-character-like section. Further, it has the electrically conducting lines 12-14 on the submount 100 to extend from near the bottom of the cup in the right direction in FIG. 2 towards a bottom of a lower step of the plate, and the other electrically conducting lines 13-17 to extend from near the bottom of the cup in the left direction in FIG. 2 towards the bottom. The submount 100 usually has a symmetrical form with respect to rotation around an axis of the T-character-like form, but its shape is not limited thereto. For example, it may be rectangular.

The LED chip 5 is bonded to the bottom of the cup on the mount base 10 with a die bonding material, and the two electrodes (not shown) provided on a top thereof are bonded with wires 6 to the portions 12, 15 provided for wiring in the electrically conducting lines.

Further, a part of the metallic plate 30 of the circuit board 300 is exposed at the side of the submount 100, and the submount 100 is mounted to the exposed portion by thermally contacting a bottom plane of the protrusion 11 opposite to the top plane for mounting the LED chip 5. The portion where the bottom plane of the mount base 10 contacts with the exposed area of the metallic plate 30 is hereinafter referred to as thermal contact portion 1. The electrically conduction lines 12-14, 15-17 are bonded with solder 42 to the patterns 41 of the circuit board 300. In this structure, a heat transfer path is provided from the mount base 10 to the metallic plate 30 so that the heat generated in the LED chip 5 can be led to the circuit board 300 readily. Further, the fabrication process can be simplified by using a solder reflow step for electrical connection for the electrical pattern 41 of the circuit board 300 wherein the thermal contact can be formed simultaneously between the mount base 10 and the circuit board 30 to improve the heat transfer efficiency. The heat transfer efficiency can be improved further by forming a metallic layer on the plane of the mount base 10 opposite to the metallic plate 30, and by bonding it with solder to the exposed area of the metallic plate 30. This also holds for the other embodiments to be explained later.

Figure 3:
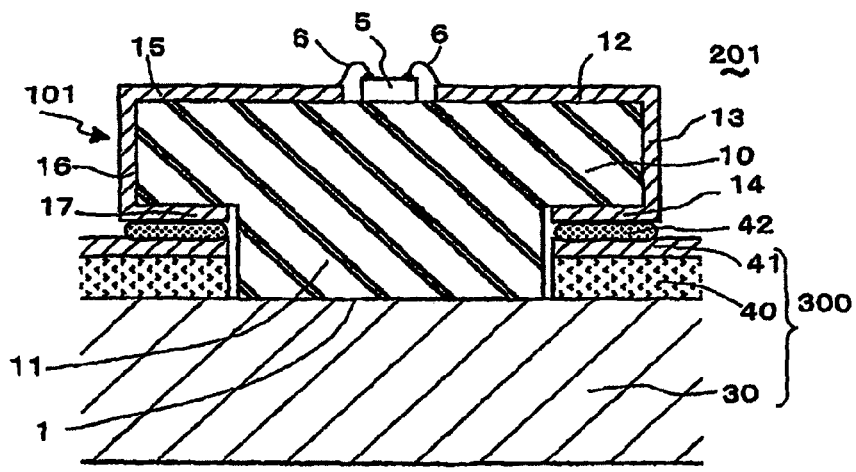
FIG. 3 is a sectional view of a light-emitting device of another embodiment of the invention.

FIG. 3 shows a light-emitting device 201 of another embodiment of the invention. This light-emitting device 201 is similar to the light-emitting device 200 of the first embodiment except that the mount base 10 of a submount 101 has a flat top plane for mounting the LED chip 5. For example, when the submount 101 is difficult to have a recess on the top plate of the mount base 10, for example, if it is made of a ceramic material, or when it is not needed to have a recess on the top plate, this type of submount can be used for mounting the LED chip 5.

Figure 4:
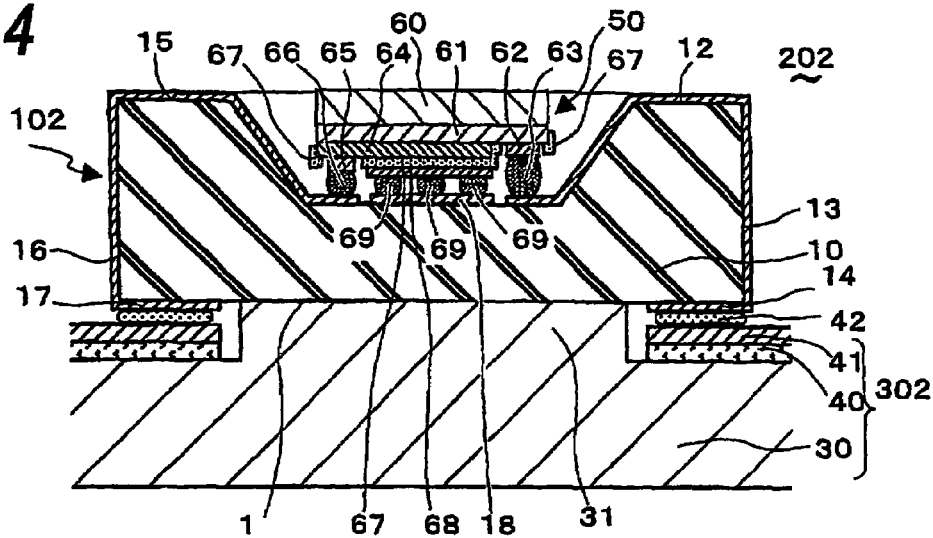
FIG. 4 is a sectional view of a light-emitting device of a further embodiment of the invention.

FIG. 4 shows a light-emitting device 202 of a further embodiment of the invention. In the light-emitting device 202, a submount 102, wherein an LED chip 50 is mounted face down on the mount base 10 (flip chip bonding), is mounted on a circuit board 302. The mount base 10 has a flat bottom plate without a protrusion, while the circuit board 302 has a protrusion 31 at the exposed area. The bonding between the submount 102 and the circuit board 302 and the like are similar to the above-mentioned light-emitting devices.

The LED chip 50 and the face down mounting thereof are explained below. The LED chip 50 has a transparent crystalline plate 60, an n-type semiconductor layer 61 and a p-type semiconductor layer 64 layered successively thereon, and electrodes 62, 65 formed on the semiconductor layers. Further, an electrically insulating layer 67 and a metallic layer 68 are formed successively on the p-type semiconductor layer 64. The LED chip 50 is mounted on the cup of the mount base 10 by setting the transparent crystal plate 60 upside and the electrodes 62, 65 downside (face down).

A dummy pattern 18 is formed, besides the electrically conducting lines 12, 15, at the bottom of the cup of the mount base 10. Bonding materials 63, 66, 69 are provided beforehand on the patterns at the bottom for bonding them with the electrodes of the LED chip 50. The n-type semiconductor layer 61 is electrically bonded with the bonding material 63 between the electrode 62 and the pattern 12 on the mount base 10. The p-type semiconductor layer 64 is electrically bonded with the bonding material 66 between the electrode 65 and the pattern 15 on the mount base 10. Further, the metallic layer 68 on the LED chip is bonded with the bonding material 69 to the dummy pattern 18 on the mount base 10.

The bonding materials 63, 66, 69 are made of a metal such as gold or an alloy for stud bumps or of solder for solder bumps. By using such bonding materials, thermal bonding between the LED chip 50 and the mount base 10 can be improved more than the wire bonding, so that the heat transfer efficiency can be improved. The number of the bonding material may be one for each of the electrodes 62 and 65, but the heat transfer efficiency can be improved further by providing a plurality of bonding materials for each electrode.

If openings of necessary areas for bonding are formed on insulating layers formed on the electrodes and on the semiconductor layers, a possibility of shortening between the bonding materials can be decreased, so that more bonding materials can be used. Alternatively, a part of the insulating layer 67 is metallized to form the metallic layer 68 insulated from the other electrodes 62 and 65, the size of the area for bonding can be increased besides the bonding for the other electrodes 62, 65, and this enhances thermal contact.

Figure 5A:
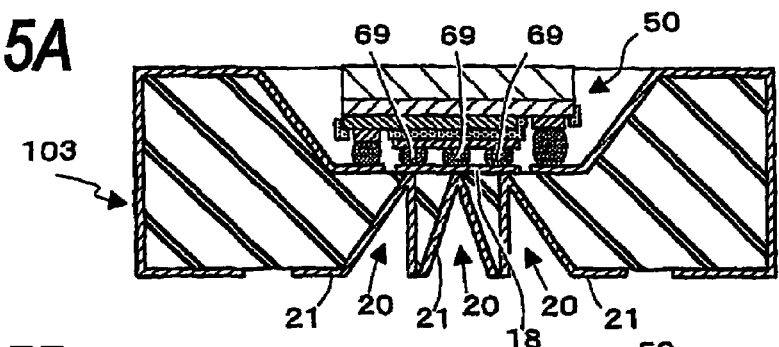
FIG. 5A is a sectional view of a submount for LED of a light-emitting device of a further embodiment of the invention.
Figure 5B:
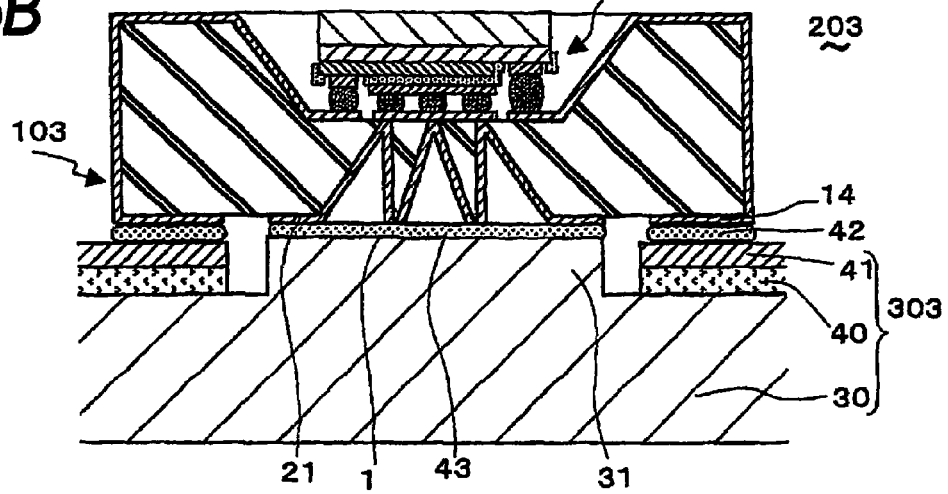
FIG. 5B is a sectional view of the light-emitting device.

FIG. 5A is a sectional view of a submount 103 for LED of a light-emitting device 203 of a further embodiment of the invention, and FIG. 5B is a sectional view of the light-emitting device 203. The submount 103 has a structure that the mount base 10 has throughholes 20 extending from the bottom of the recess on the top for mounting the LED chip 50 to the bottom plate of the mount base 10. The size of the throughholes 20 is increased towards the bottom of the mount base 10, and metallic layers 21 are formed on the inner surfaces of the throughholes 20 with soldering or the like, similarly to the pattern 12. When the submount 103 is mounted on a circuit board 303, the metallic layers 21 on the throughholes 20 are connected with the solder 43 to the exposed metallic area of the metallic plate 30 of the circuit board 303. In this structure, because heat generated in the LED chip 50 conducts through the metallic layers 21 having thermal conductivity higher than a conventional mount base towards the circuit board 303. Then, the heat transfer efficiency can be improved further.

Figure 6:
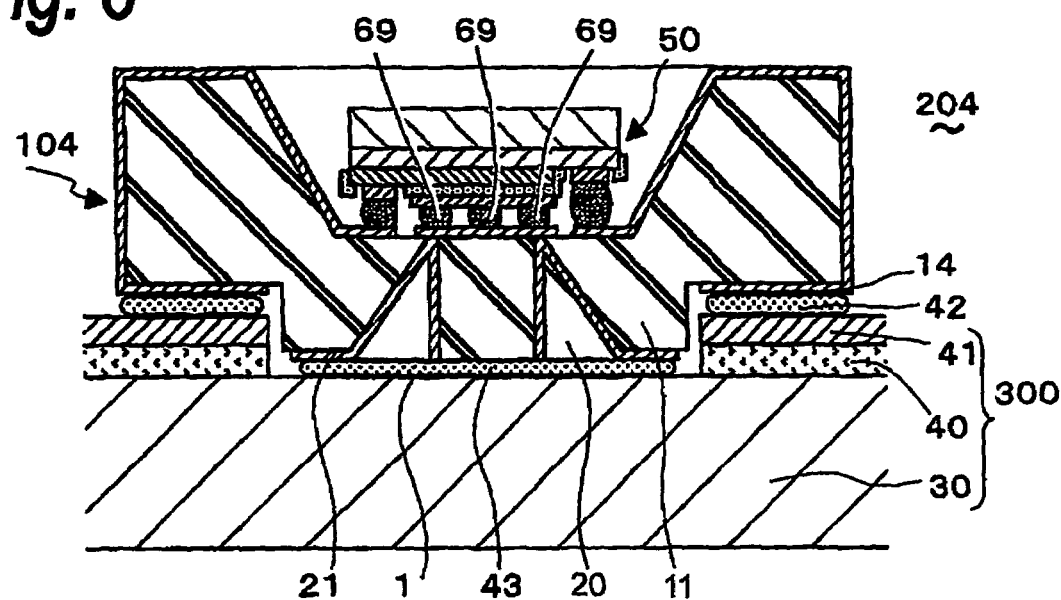
FIG. 6 is a sectional view of a further embodiment of a light-emitting device of an embodiment of the invention.

FIG. 6 shows a light-emitting device 204 of a further embodiment of the invention with the mount base 10 having throughholes 20. The light-emitting device 204 is different from the light-emitting device 203 shown in FIGS. 5A and 5B in that a submount 104 has a protrusion 11 at the bottom thereof. The metallic plate 30 of the circuit board 300 has a flat exposed area. A similar advantage to the previous embodiment can be realized in this structure.

Figure 7:
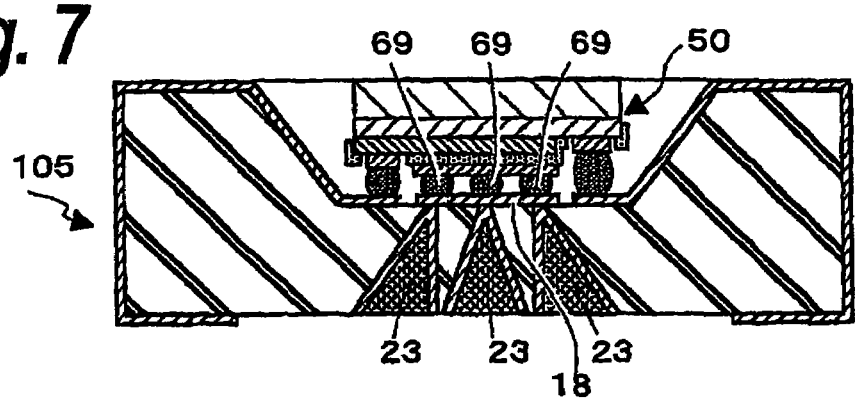
FIG. 7 is a sectional view of a submount for LED of a light-emitting device of a further embodiment of the invention.

FIG. 7 shows a submount 105 of a further embodiment of the invention having throughholes filled with a filler 23 such as copper, silver or solder having a higher thermal conductivity than the mount base 10. Thus, the heat transfer efficiency can be improved further than the light-emitting device shown in FIGS. 5A, 5B and 6.

Figure 8:
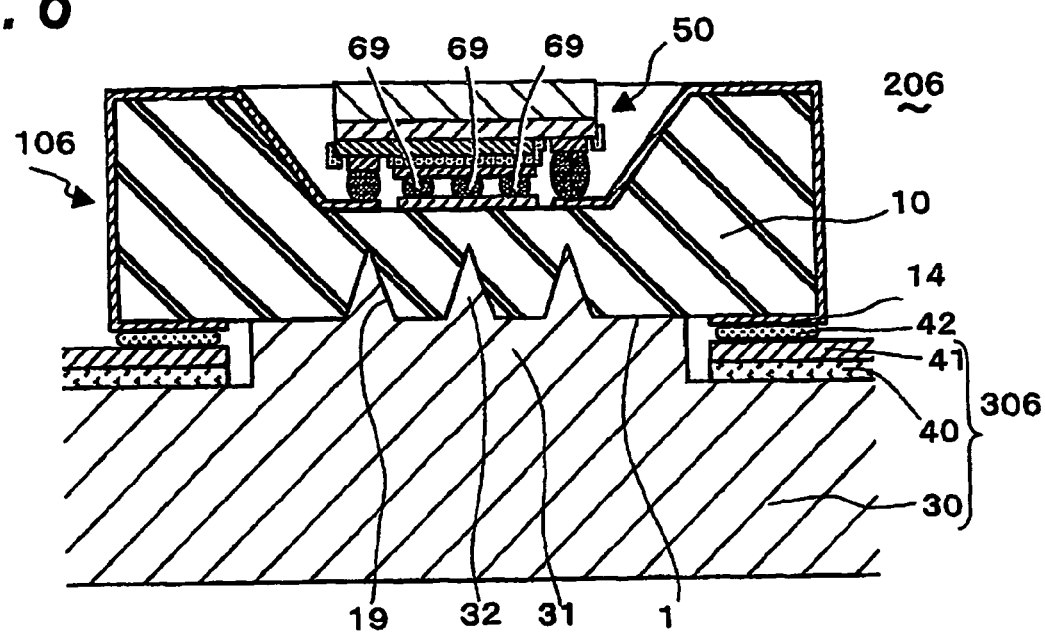
FIG. 8 is a sectional view of a light-emitting device of a further embodiment of the invention.
Figure 9:
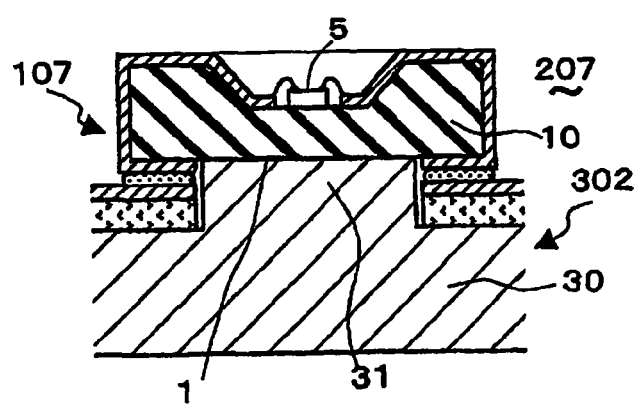
FIG. 9 is a sectional view of a further embodiment of a light-emitting device of an embodiment of the invention.

FIG. 8 shows a light-emitting device 206 of a further embodiment of the invention. A submount 106 of the light-emitting device. 206 is similar to the mount base 10 of the submount 102 shown in FIG. 4 except that V-character type recesses 19 are formed at the bottom of the mount base 10 of the submount 106. A circuit board 306 is similar to the circuit board 302 shown in FIG. 4 except that it has V-character-like projections 32 in a protrusion 31 of the metallic plate 30 of the circuit board 302 in correspondence to the recesses 19. The light-emitting device 206 is fabricated by fitting the projections 32 of the metallic plate 30 to the recesses 19 of the submount 106. In this structure, the contact area between the mount base 10 and the metallic plate 30 can be enlarged. Then thermal contact between them becomes sure, the thermal resistance between them is decreased, and the heat transfer efficiency for the LED chip 50 is improved. Further, the aligning of the submount 106 and the circuit board 306 can be performed easily in a step for mounting the submount 106 to the circuit board 306.

FIGS. 9 to 12 show four types of light-emitting devices 207 to 210 according to a further embodiment of the invention having different combinations on the structure of thermal contact between the submount and the circuit board. First, in the light-emitting device 207 shown in FIG. 9, the position of the protrusion in the light-emitting device shown in FIG. 2 is changed upside down. That is, in the light-emitting device 200 shown in FIG. 2, the exposed area of the metallic plate 30 of a circuit board 308 is flat, while in the light-emitting device 207, the exposed area has a protrusion 31 which contacts with the flat bottom of the mount base 10. In this case, the distance between the LED chip 5 and the metallic plate 30 becomes shorter than the counterpart in the light-emitting device 200 shown in FIG. 2, so that the heat transfer efficiency is improved.

Figure 10:
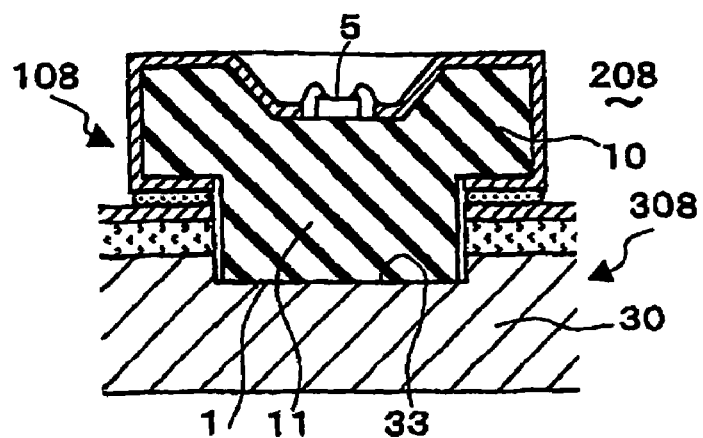
FIG. 10 is a sectional view of another light-emitting device of a further embodiment of the invention.
Figure 11:
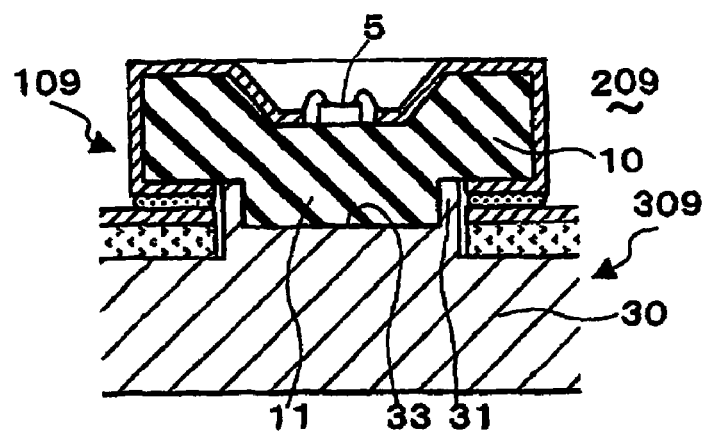
FIG. 11 is a sectional view of a light-emitting device of a further embodiment of the invention.
Figure 12:
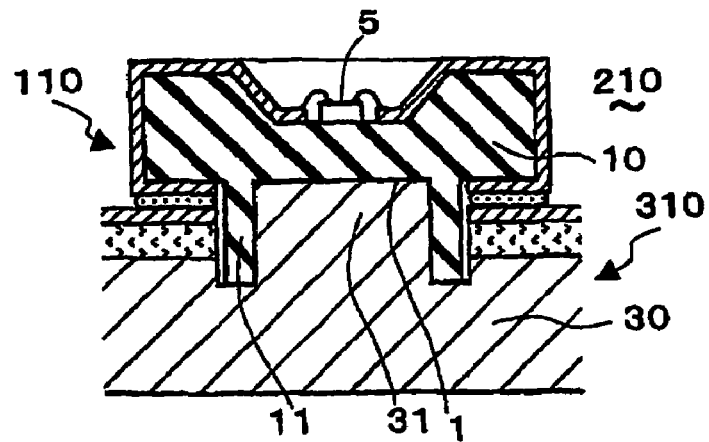
FIG. 12 is a sectional view of a light-emitting device of a further embodiment of the invention.

On the other hand, in the light-emitting devices 208, 209 and 210 shown in FIGS. 10, 11 and 12, one of the bottom plane of the mount base 10 and the exposed area of the metallic plate 30 has a protrusion, while the other has a recess, and the protrusion is fitted to the recess. It is to be noted that the light-emitting devices 209 and 210 have structures with double combinations of protrusion and recess wherein a protrusion or recess has further an inner recess or protrusion. In these structures where the recesse(s) are fitted to the protrusion(s), the aligning of the submount with the circuit board can be performed more precisely in the fabrication process while keeping heat transfer efficiency.

In the light-emitting device 209 shown in FIG. 11, a recess 33 is formed in a protrusion 31 of the metallic plate 30, and the recess 33 of the metallic plate 30 is fitted to the protrusion 11 of the mount base 10. In this structure, the thermal contact area at the thermal contact 1 of the circuit board 309 with the mount base 10 of the submount is larger than that in the light-emitting device 208 shown in FIG. 10, so that the heat transfer efficiency is improved further.

The light-emitting device 210 shown in FIG. 12 has a similar structure to the light-emitting device 208 shown in FIG. 10 except that a recess is formed in a protrusion 11 of the mount base 10 to be fitted to a protrusion 31 of the metallic plate 30. Therefore, similar to the light-emitting device 208, the contact area between the metallic plate 30 and the mount base 10 is larger than that of the light-emitting device 208, and the distance between the LED chip 5 and the metallic plate 30 is shorter, so that the heat transfer efficiency is improved further.

Figure 13:
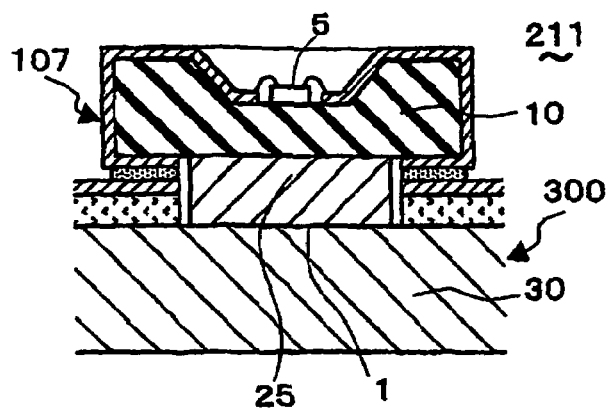
FIG. 13 is a sectional view of a light-emitting device of a further embodiment of the invention.

FIG. 13 shows a light-emitting device 211 of a further embodiment of the invention. In the light-emitting device 211, the protrusion 11 in the light-emitting device 200 shown in FIG. 2 is replaced with a metallic plate 25 having a higher thermal conductivity. Therefore, the thermal resistance is decreased more than in the light-emitting device 200 shown in FIG. 2 to improve the heat transfer efficiency. Alternatively, a circuit board 300 may have a thin insulator layer 40 (for example, a thickness equal to or smaller than about 100 micrometers) and a layer is formed with solder, silver paste or the like instead of the metallic plate 25.

Figure 14:
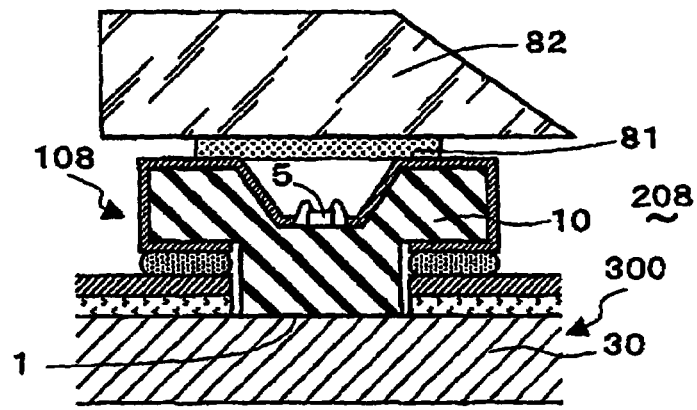
FIG. 14 is a sectional view of an application of a light-emitting device of a further embodiment of the invention.
Figure 15:
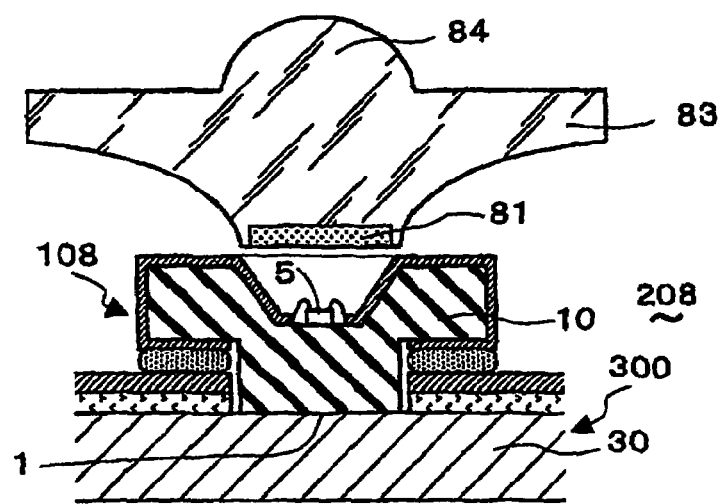
FIG. 15 is a sectional view of another application of a light-emitting device of the embodiment of the invention.

Next, FIGS. 14 and 15 show applications of the above-mentioned light-emitting devices. FIG. 14 shows an application of one 208 of the above-mentioned light-emitting devices for a backlight of a liquid crystal display, a lighting portion of a traffic sign or the like. In order to emit a light of a desired lighting color, an LED chip 5 for emitting a predetermined color is selected, and it is combined with a fluorescent member 81 including a fluorescent material having a function to convert the color. The light having the desired color is obtained by the LED chip 5 and the fluorescent member 81, and it enters into a guiding plate 82 to be guided towards a display section (not shown) and emitted to the outer space.

Further, in the application shown in FIG. 15, a light is obtained by the light-emitting device 208 combined with a fluorescent member 81 as mentioned above, and it is entered to an optical component 83 having a lens part 84, and the light condensed by the lens part 84 is transmitted in a predetermined direction.

Figure 16:
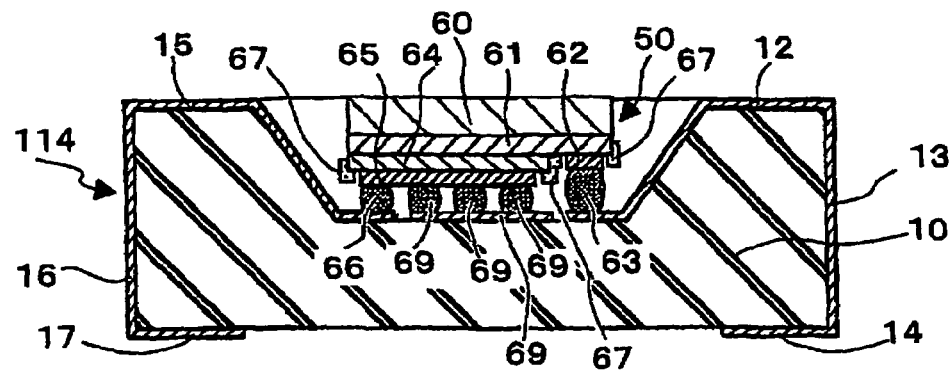
FIG. 16 is a sectional view of a submount for LED of a light-emitting device of a further embodiment of the invention.

FIG. 16 shows a submount 114 for a light-emitting device according to a further embodiment of the invention. In the above-mentioned embodiments having the submount with the face down LED chip as shown in FIG. 4, the bonding materials 69 are isolated electrically from the other electrode 65. In the submount 114, bonding materials 69 are connected to a portion extended from the electrode 65 on the p-type semiconductor layer 64. In this structure, no new electrode is needed for connecting the bonding materials 69, and the fabrication process becomes simpler.

Figure 17:
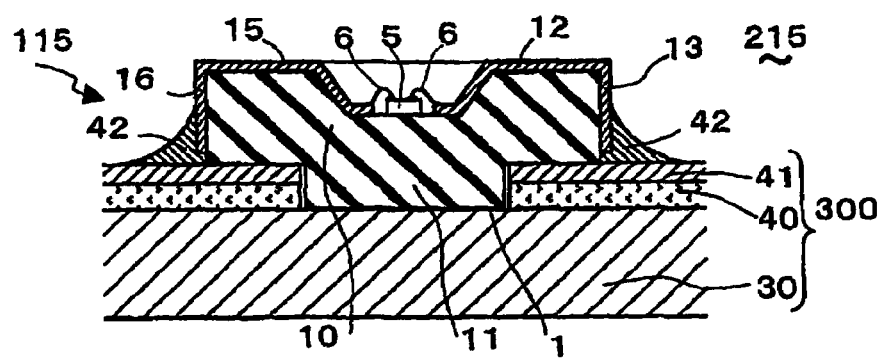
FIG. 17 is a sectional view of a light-emitting device of a further embodiment of the invention.
Figure 18:
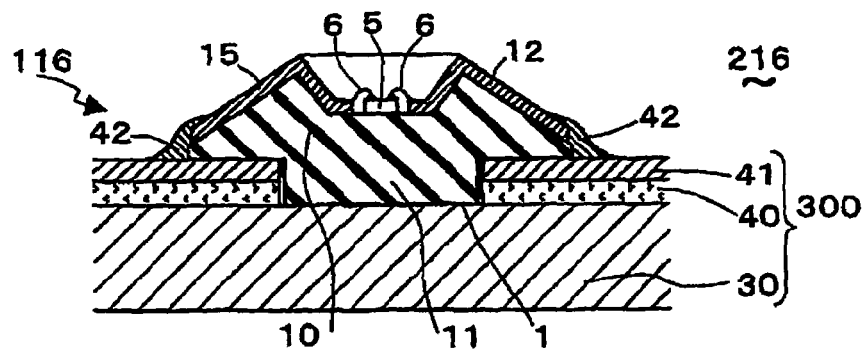
FIG. 18 is a sectional view of a light-emitting device of a further embodiment of the invention.

FIGS. 17 and 18 show submounts 115, 116 for light-emitting device 215, 216 according to a further embodiment of the invention. These light-emitting devices have different types of the submount. The electrically conducting lines of the mount base 10 are not extended so as to have a section parallel to the metallic pattern 41 of the circuit board 300.

In the light-emitting device 215 shown in FIG. 17, the submount 115 is mounted to the circuit board 300 by bonding the electrically conducting lines 13, 16 of the mount base 10 with a solder 42 to the metallic pattern 41 of the circuit board 300. The submount 115 is bonded at two sides thereof with solder 42, while in the light-emitting device 200 shown in FIG. 2 the submount 100 is bonded with solder 42 at the bottom side thereof. Because the submount 115 does not have electrically conducting lines at the bottom thereof, the fabrication process becomes simpler. Further, because no solder layer is present between the submount 115 and the circuit board 300, the size of the lighting device does not change due to the solder layer. Then the size in this direction can be set precisely, and the reliability of the thermal contact becomes higher.

In the light-emitting device 215 shown in FIG. 17, a top of the mount base 10 has planes inclined towards the circuit board 300, and the electrically conducting lines 12, 15 are extended thereon. Similarly to the submount shown in FIG. 17, no solder layer is present between the submount 115 and the circuit board 300, so that the fabrication process becomes simpler. Further, because the top of the submount is not flat and shoulders thereof become lower, the amount for the mount base can be decreased, and the size of the lighting device does not change due to the solder layer.

Next, modifications of the above-mentioned embodiments are explained. In the light-emitting devices 203 and 204 shown in FIGS. 5 and 6, the thermal contact 1 between the submount and the exposed area of the metallic plate is bonded with solder, while in the others the submount contacts with the exposed area of the metallic plate at the thermal contact 1 without an intermediate member between them. In the others a metallic layer may be formed at the bottom of the mount base, and the submount may be bonded with solder to the exposed area of the metallic plate. Then the heat transfer efficiency may be increased further. In the fabrication process, the solder layer may be formed at the thermal contact, simultaneously in the reflow step as the electrical connection for the patterns.

When a solder layer is formed at the thermal contact 1, it is preferable that the position of the thermal contact is lower than the height of the pattern 41 of the circuit board. For example, in the light-emitting device 200 shown in FIG. 2, when the thermal contact is soldered, it can be prevented that the patterns 14 and 17 are short-circuited with solder. In the light-emitting devices 208 and 210 shown in FIGS. 10 and 12, the contact portions at the most outside are still lower than the insulator layer of the circuit board 309, 310, so that the short-circuit at the thermal contact can be prevented surely.

Next, a series of light-emitting devices are explained having one or more grooves at a plane of the mount base 10 of the submount in contact with the metallic plate 30 of the circuit board. As explained above in the background art, a part of the energy is outputted as a light emitted from the p and n layers of the LED chip, but a large part thereof is converted to heat. A part of the heat generated in the LED chip is transferred to the outside in the forms of convection and thermal radiation, but a large part thereof conducts through the bonding materials or the like to the mount base, and further through the solder at the bottom thereof to the circuit board and radiated from the surface of the circuit board, In the conduction path mentioned above, heat resistance is largest in the mount base having low thermal conductivity (0.3-10 W/mK). The heat resistance is proportional to the thickness of the mount base in the thickness direction and is inversely proportional to the thermal conductivity. Therefore, it is desirable that the thickness of the mount base below the LED chip is small. However, the decrease in the thickness of the mount base below the LED chip, or the main conduction path, makes it difficult to form the mount base. Further, this decreases the strength of the mount base, so that the mount base is liable to be broken in a fabrication step for mounting the LED chip to the mount base. Then one or more grooves are formed on the mount base as explained below, so that the mount base can be formed easily while keeping the strength thereof, while the thermal resistance of the mount base can be decreased substantially.

Figure 19A:
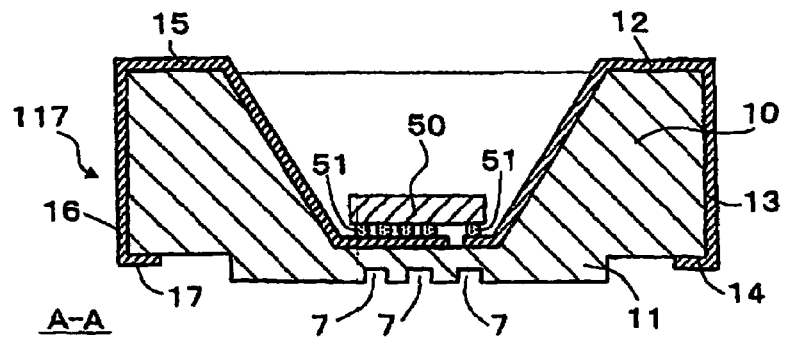
FIG. 19A is a sectional view of a submount for LED of a light-emitting device of a further embodiment of the invention.
Figure 19B:
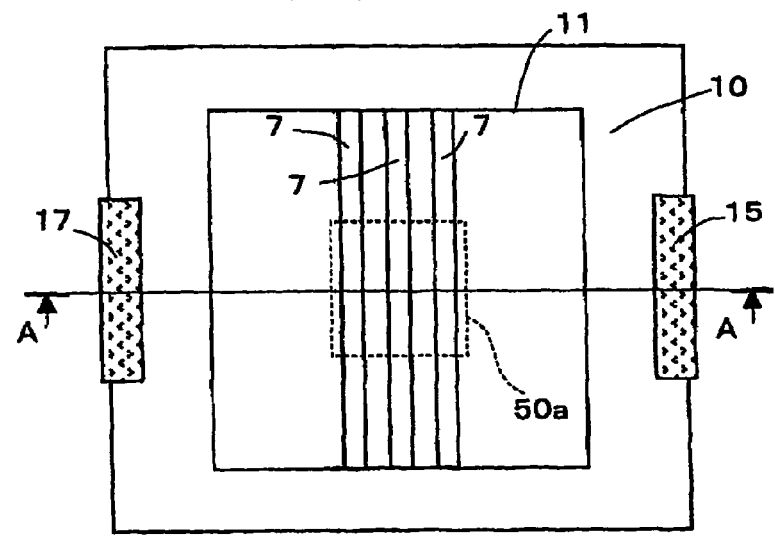
FIG. 19B is a bottom plan view of the submount for LED.

FIGS. 19A to 19D show a first example of a light-emitting device of having grooves on the mount base. In this example, a plurality of grooves (concave portions) are provided in parallel to each other on the bottom of the mount base 10. As shown in FIGS. 19A and 19B, an LED chip 50 is mounted face down on the bottom of a recess formed at the top of the mount base10 of a submount 117 with bonding members 51 (flip chip). The mount base 10 is made of, for example, alumina, and has a protrusion 11 at the bottom thereof. As shown in FIG. 19B, three grooves 7 are formed in parallel at the center of the protrusion 11. The grooves 7 are positioned to pass through an area 50*a*, which is a projection image of the LED chip 50 in the vertical direction, in order to radiate heat efficiently. That is, the average thickness of the mount base 10 below the LED chip 50 becomes smaller, or the heat resistance at this area is decreased.

Figure 19C:
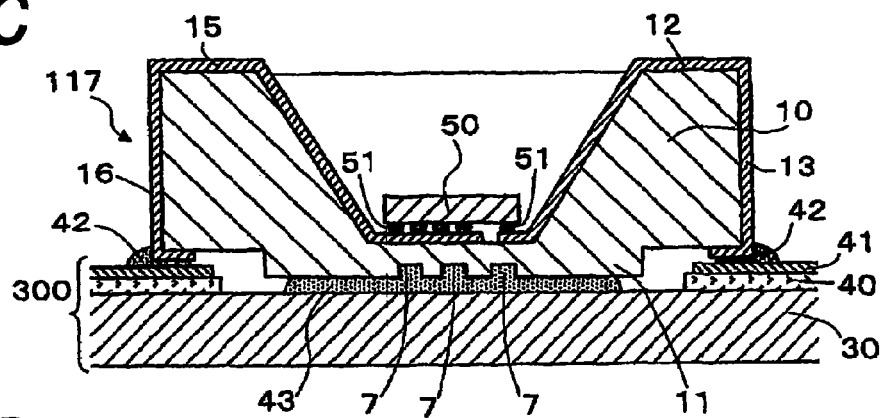
FIG. 19C is a sectional view of the light-emitting device.

When the submount 117 is mounted on the circuit board 300, as shown in FIG. 19C, a solder layer 7 is formed between the bottom of the mount base 10 and the top of the circuit board 300. The solder layer 30 also fills the grooves 7, so that the average heat resistance between the LED chip 50 and the metallic plate 30 is further decreased by providing the solder layer 7.

By using the structure having the above-mentioned grooves 7, even for a mount base made of a relatively brittle material such as alumina the thickness can be decreased while keeping the strength. Further, a metallic film may be formed, for example, with copper plating having higher thermal conductivity (313 W/mK). The thermal resistance can be decreased further to a large extent by filling solder (thermal conductivity, 50 W/mK) into the grooves 7. Because the thermal resistance of the mount base 10 below the LED chip 50 as the main conduction path is decreased, the temperature rise of the LED chip 50 can be decreased. Deposition or the like may be used for forming the metallic film. The metallic film may be made of copper, gold, silver or the like having a higher thermal conductivity than the mount base 10 and having good wetness for bonding. By providing a copper film or the like on the surface of the grooves 7, the transfer of heat from the mount base 10 to the metallic plate 30 is facilitated. The filler for filling the grooves 7 as an auxiliary material for heat transfer is not limited to the above-mentioned solder. For example, silver paste, silicone resin or the like may be used having higher thermal conductivity than the mount base 10. The auxiliary material for heat transfer may be a soldered metallic wire such as a soldered copper wire.

Figure 19D:
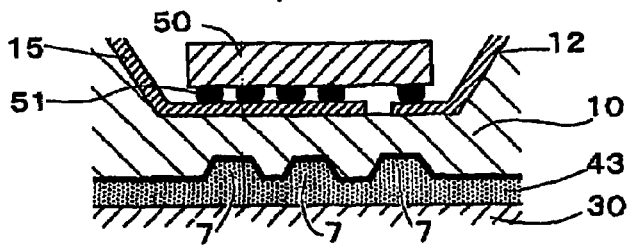
FIG. 19D is a sectional view of a modified example of the light-emitting device.

As shown in FIG. 19D, the grooves 7 may have side walls with a space between them increasing from the bottom to the opening thereof. Because the grooves 7 are broadened towards the openings thereof, the heat transfer from the mount base 10 to the metallic plate 30 of the circuit board is facilitated more than the grooves shown in FIG. 18C. Further, in this structure of the grooves 7, the filler such as solder can be filled into the grooves 7 while suppressing the generation of bubbles. Therefore, this structure is advantageous for improving the heat transfer efficiency.

Figure 20A:
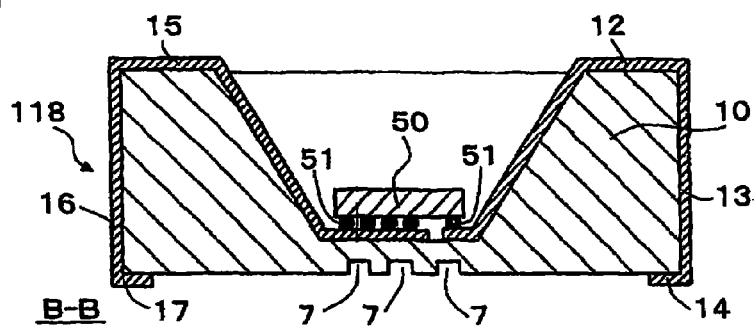
FIG. 20A is a sectional view of a submount for LED of a light-emitting device of a further embodiment of the invention.
Figure 20B:
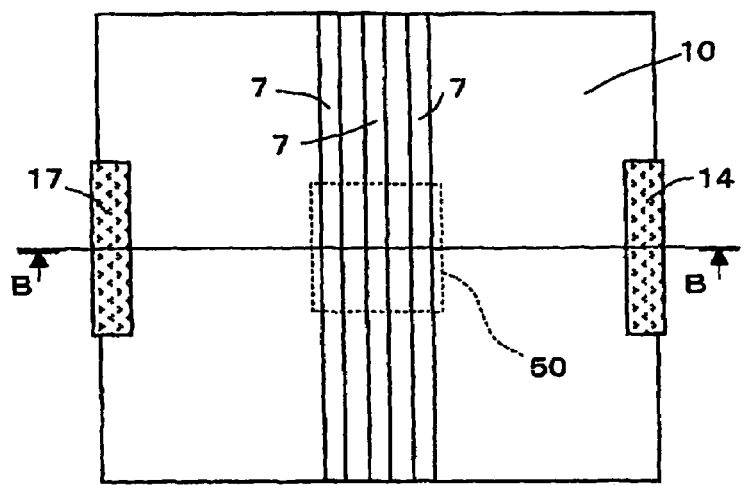
FIG. 20B is a bottom plan view of the submount for LED.
Figure 20C:
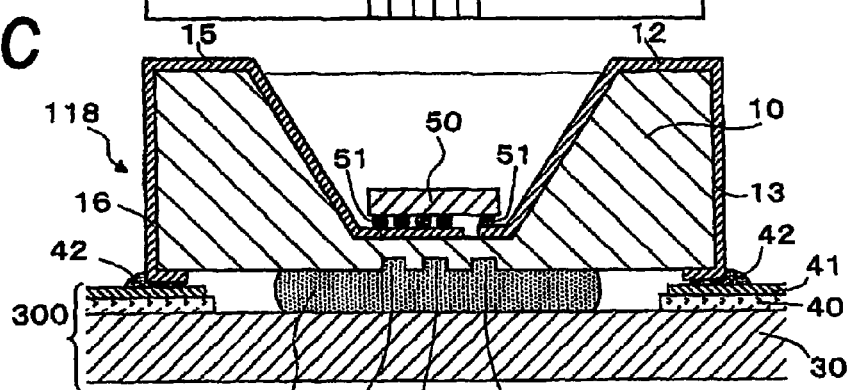
FIG. 20C is a sectional view of the light-emitting device.

FIGS. 20A to 20D show a modified example of the above-mentioned light-emitting device. The submount 117 shown in FIG. 19 has the protrusion 11 similarly to the submount 100 shown in FIG. 2 below the mount base 10, while a submount 118 of this example without a protrusion may have grooves 7 at the bottom of the mount base 10. As shown in FIGS. 20A and 20B, the grooves 7 can be formed in parallel on the entire bottom.

When the submount 118 is mounted on the circuit board 300, as shown in FIG. 19C, the circuit board 300 may have a thin insulator layer 40 (for example, equal to or smaller than about 100 micrometers), and the submount 118 may be mounted directly on the metallic plate 30 of the circuit board 300 by using a solder layer 43 formed by the bonding besides the bonding with solder 42 for the conduction layers.

Figure 20D:
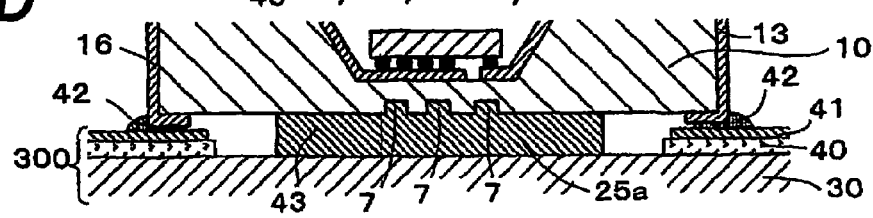
FIG. 20D is a sectional view of a modified example of the light-emitting device.

Alternatively, when the submount 118 is mounted on the circuit board 300, the plate 300 having a protrusion as shown in FIG. 4 may be used to contact with the bottom of the mount base 10. Alternatively, as shown in FIG. 20D, a metallic member 25*a* having protrusion to be fitted with the grooves 7 may be interposed between the mount base 10 and the metallic plate 30.

Next, a result of conduction simulation is explained on the light-emitting device having the submount 117, 118 with the above-mentioned grooves 7. The conduction simulation is performed on three cases where the heating condition of the LED chip and the ambient temperature are kept the same. In a first case, the grooves are not provided on the bottom of the mount base 10; in a second case the grooves 7 are provided on the mount base 10 at equal distance between them; and in a third case the grooves 7 are provided on the mount base 10 so that the total volume of the spaces in the grooves is the same as in the second case, but the grooves 7 are provided just below the bonding materials of the LED chip 5. The simulation result shows that the temperature of the LED chip 5 is decreased in the order of the first case, second case and the third case. If the temperature of the LED chip 5 in the first case is set to 100, it deceases to 83 for the second case and to 77 in the third case. Therefore, it is found that if the grooves 7 are provided just below the bonding materials 51 of the LED chip 50, the heat transfer efficiency is improved further, and the temperature rise or the LED chip 50 can be decreased.

Figure 21:
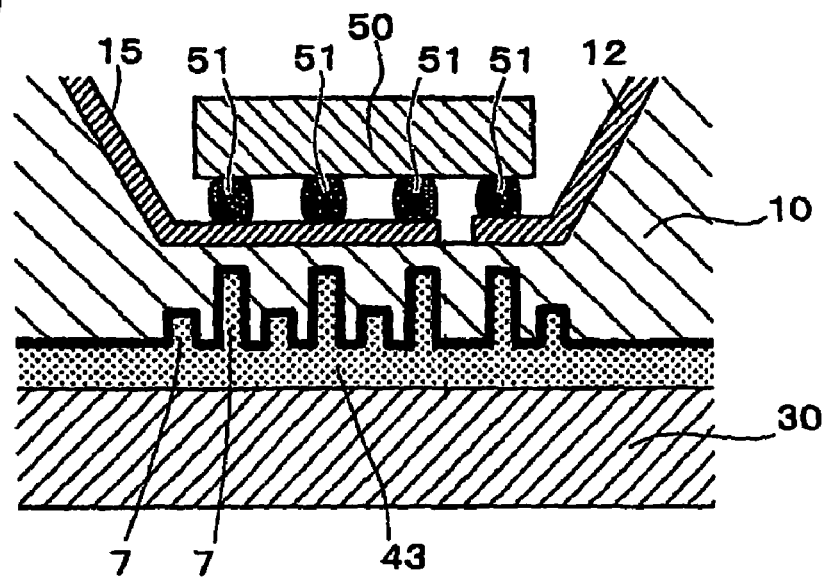
FIG. 21 is a sectional view of a further embodiment of a light-emitting device of an embodiment of the invention.

FIG. 21 shows a light-emitting device of a further embodiment of the invention having a groove structure. In the light-emitting device the grooves 7 just below the bonding members 51 have the depth thereof deeper than the others. In this structure of the grooves 7, the thickness of the mount base 10 just below the LED chip 50 can be decreased further without decreasing the strength of the mount base 10. Then the thermal resistance from the LED chip 50 to the metallic plate 30 can be decreased further, and the temperature rise of the LED chip 50 can be lowered.

Figure 22:
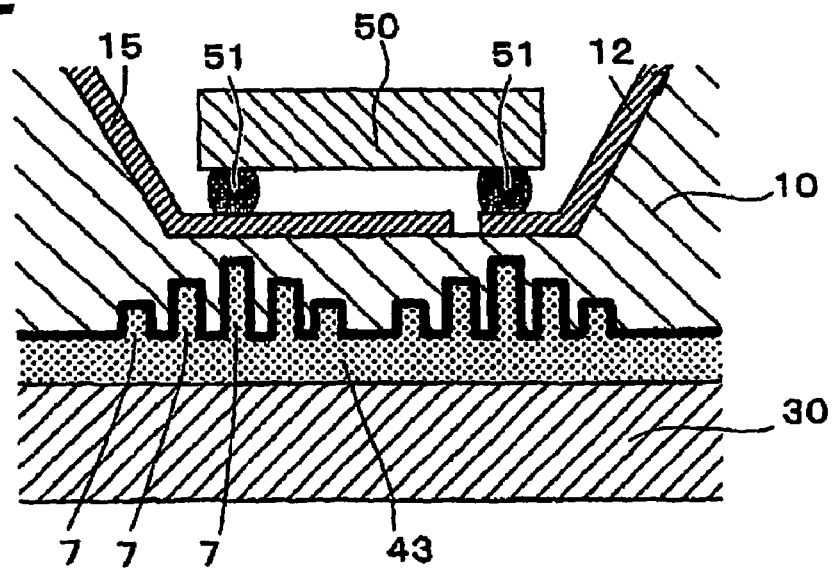
FIG. 22 is a sectional view of a light-emitting device of a further embodiment of the invention.

FIG. 22 shows a light-emitting device of another embodiment of the invention having a groove structure. In the light-emitting device, the grooves 7 are arranged so that grooves 7 just below the bonding members 51 have the deepest depth, while grooves adjacent to one of the grooves having the deepest depth have depths decreasing stepwise with increase in the distance from the one of the grooves having the deepest depth. Similarly to the light-emitting device shown in FIG. 21, the thickness of the mount base 10 just below the LED chip 50 can be decreased further without deteriorating the strength of the mount base 10. Then the thermal resistance from the LED chip 50 to the metallic plate 30 can be decreased further, and the temperature rise of the LED chip 50 can be lowered.

Figure 23:
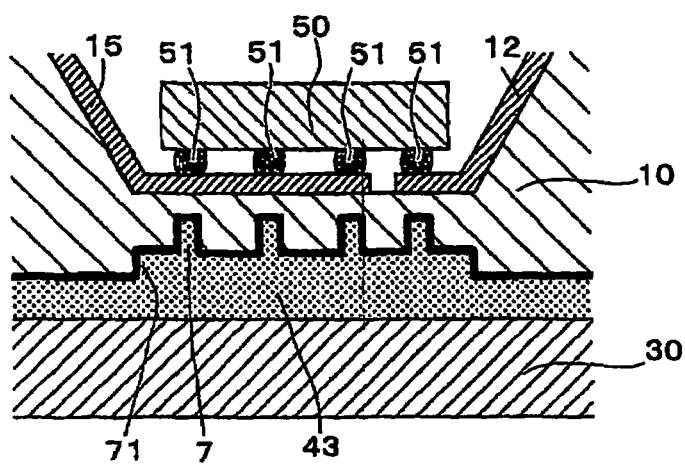
FIG. 23 is a sectional view of a light-emitting device of a further embodiment of the invention.
Figure 24:
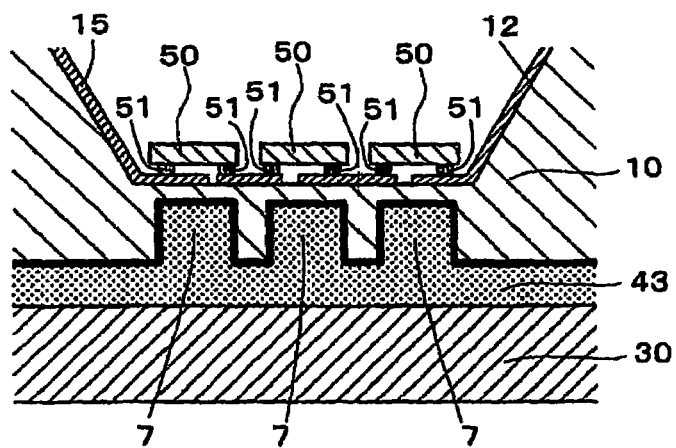
FIG. 24 is a sectional view of a light-emitting device of a further embodiment of the invention.
Figure 25:
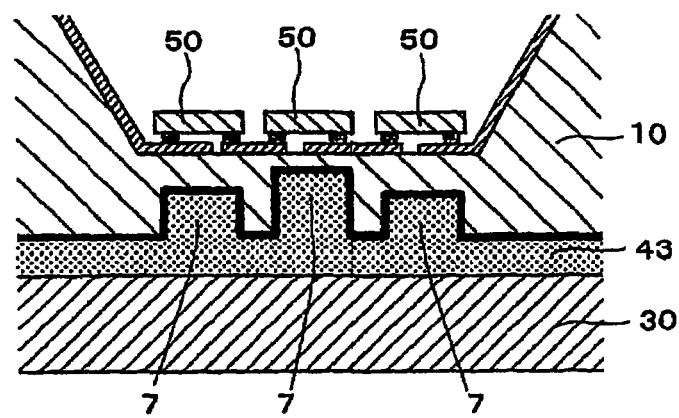
FIG. 25 is a sectional view of a light-emitting device of a further embodiment of the invention.
Figure 26:
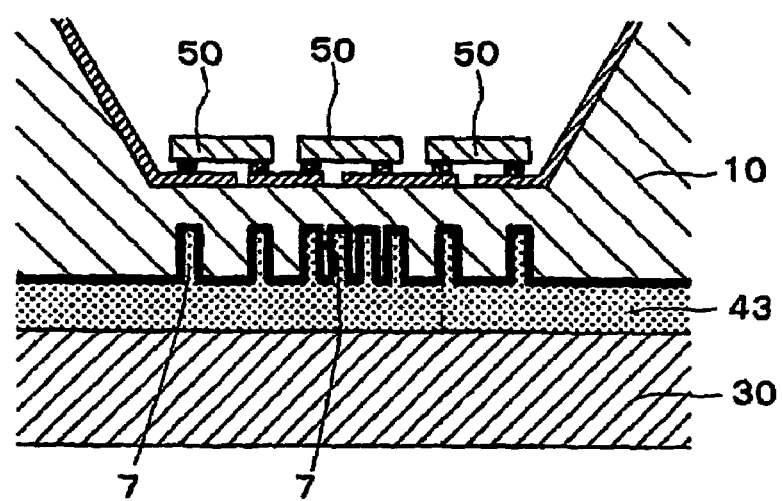
FIG. 26 is a sectional view of a light-emitting device of a further embodiment of the invention.
Figure 27:
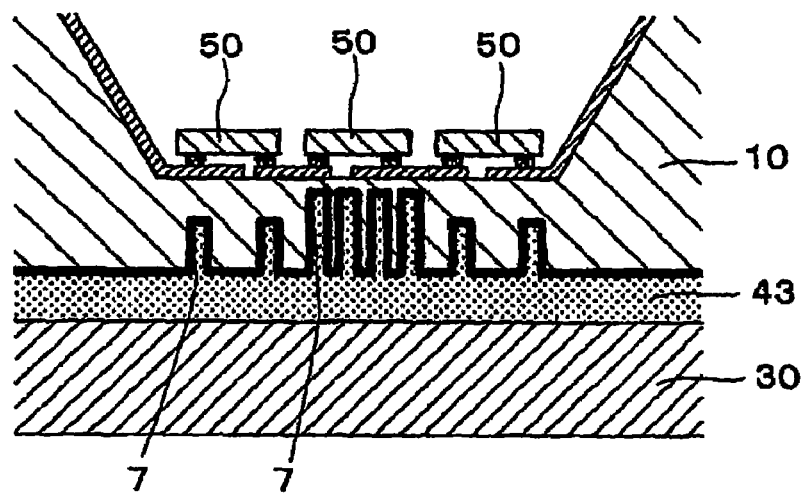
FIG. 27 is a sectional view of a further embodiment of a light-emitting device of an embodiment of the invention.
Figure 28:
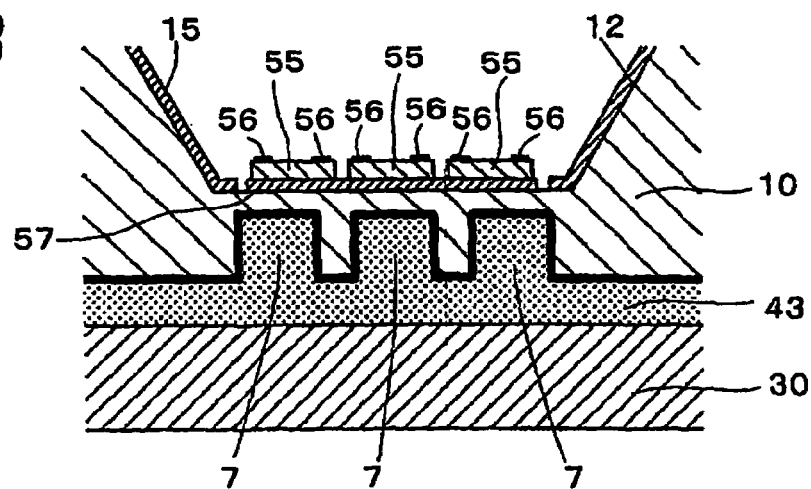
FIG. 28 is a sectional view of a light-emitting device of a further embodiment of the invention.
Figure 29:
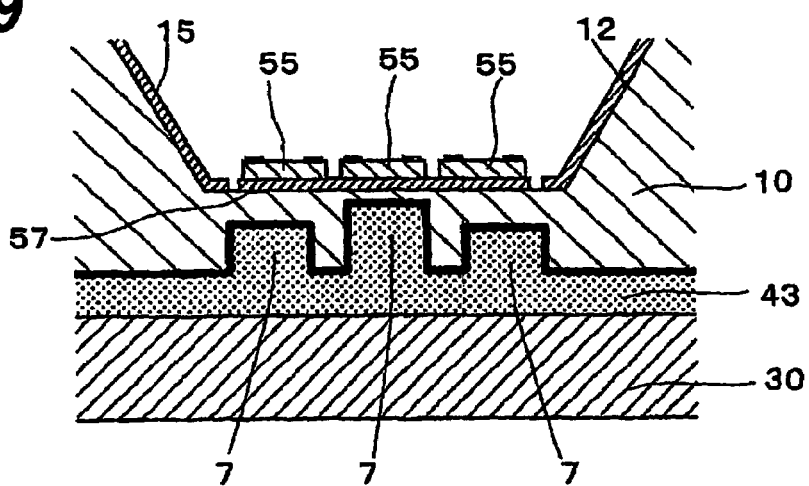
FIG. 29 is a sectional view of a light-emitting device of a further embodiment of the invention.
Figure 30:
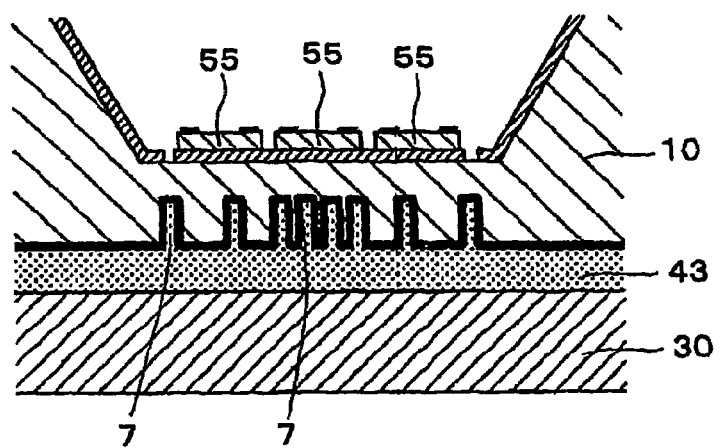
FIG. 30 is a sectional view of a light-emitting device of a further embodiment of the invention.
Figure 31:
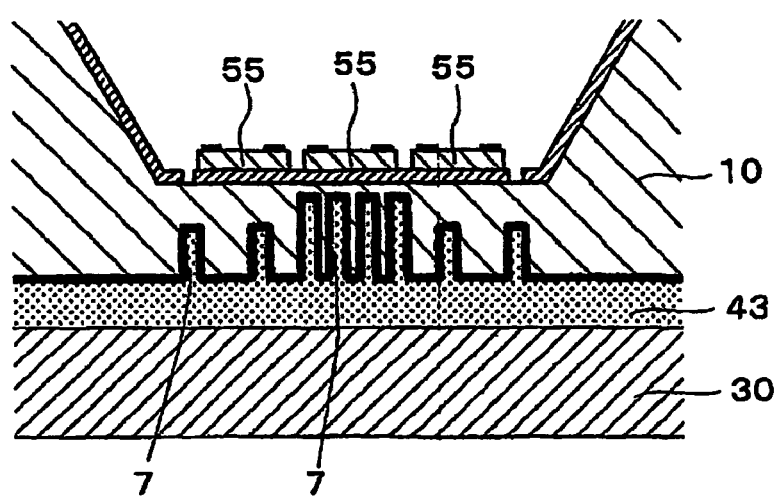
FIG. 31 is a sectional view of a light-emitting device of a further embodiment of the invention.

FIG. 23 shows a light-emitting device of a further embodiment of the invention having a groove structure. In the light-emitting device, a wide recess 71 is provided in the bottom of the mount base 10 below the LED chip 50, and grooves 7 are provided inside the recess 71 below the bonding materials 51 for the LED chip 50. Because the recess 71 is wide and the depth of the grooves 7 is shallower than the counterparts in FIG. 22, solder enters into and fills the grooves 7 more easily.

FIGS. 24-27 show light-emitting devices of further embodiments of the invention having a groove structure and a plurality of LED chips 50. In the light-emitting devices, the LED chips 50 are mounted adjacent to each other at a center of the mount base 10, while grooves (or recesses) 7 are provided on the mount base 10 below the LED chips 50. In the light-emitting device shown in FIG. 24, the grooves 7 have the same size. In the light-emitting device shown in FIG. 25, the depth of the groove 7 is deepest for the central LED chip 50 among the plurality of LED chips 50 and becomes shallower at both sides thereof according to the distance from the central groove for the central LED chip 50. In the light-emitting device shown in FIG. 26, a plurality of grooves of narrow width are provided for each of the LED chips 50, and the number or the density of the grooves below an LED chip 50 becomes highest for the central LED chip 50. Further, the light-emitting device shown in FIG. 27 has grooves 7 similarly to those shown in FIGS. 25 and 26, but the grooves for the central LED chip 50 have the highest density and the deepest depth. Then, the central LED chip 50 can radiate heat efficiently, so that the temperature distribution of the LED chips 50 can be made even.

FIGS. 28 to 31 show light-emitting devices of further embodiments of the invention having a groove structure similarly to those shown in FIGS. 24 to 27, but having LED chips 55 mounted faceup. The LED chips 55 are mounted with a bonding material 57 such as a die bonding member or a plated layer. The electrical connection to electrodes 56 of the LED chips 55 is performed with wire bonding. In the light-emitting devices, the structure of the grooves 7 has an advantage to make temperature distribution even and to radiate heat efficiently, similarly to the above-mentioned light-emitting devices.

Figure 32A:
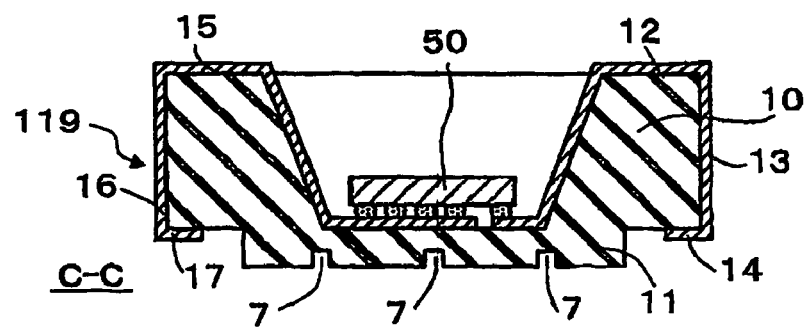
FIG. 32A is a sectional view of a submount for LED of a light-emitting device of a further embodiment of the invention.
Figure 32B:
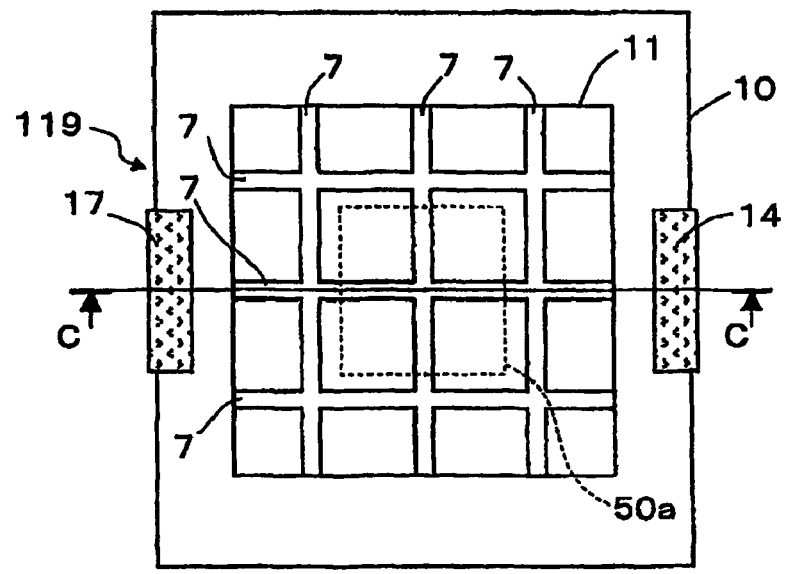
FIG. 32B is a bottom plan view of the submount.

FIGS. 32A and 32B show a submount 119 of a further embodiment of the invention having a groove structure. In the submount 119, as shown in FIG. 32B, grooves 7 are formed on the bottom (or rear) thereof in vertical and transverse directions. When the submount 119 is mounted on the circuit board 300, solder or the like is interposed between the bottom of the submount 119 and the circuit board, and as shown above in FIG. 20D, it is filled into the grooves 7.

In the structure of the mount base 10, the grooves 7 can be formed vertically and transversely at a higher density than the counterparts shown in FIGS. 19 and 20 wherein the grooves 7 are arranged only in one direction, without decreasing the strength of the mount base 10. Further, the heat can be radiated efficiently from the LED chip 50 to the circuit board 30, and the temperature of the LED chip 50 can be decreased further. Further, because the grooves 7 are formed both vertically and transversely, air may leak easily from a side plane of the protrusion when solder. 53 is filled into the grooves 7. Therefore, it becomes easier to fill solder into the grooves 7. Further, because the thermal conductivity of solder 43 is higher than the mount base 10, heat can be radiated efficiently. If the LED chip 50 is mounted above the crossings of the vertical and transverse grooves, the heat transfer can be performed more efficiently.

Figure 33:
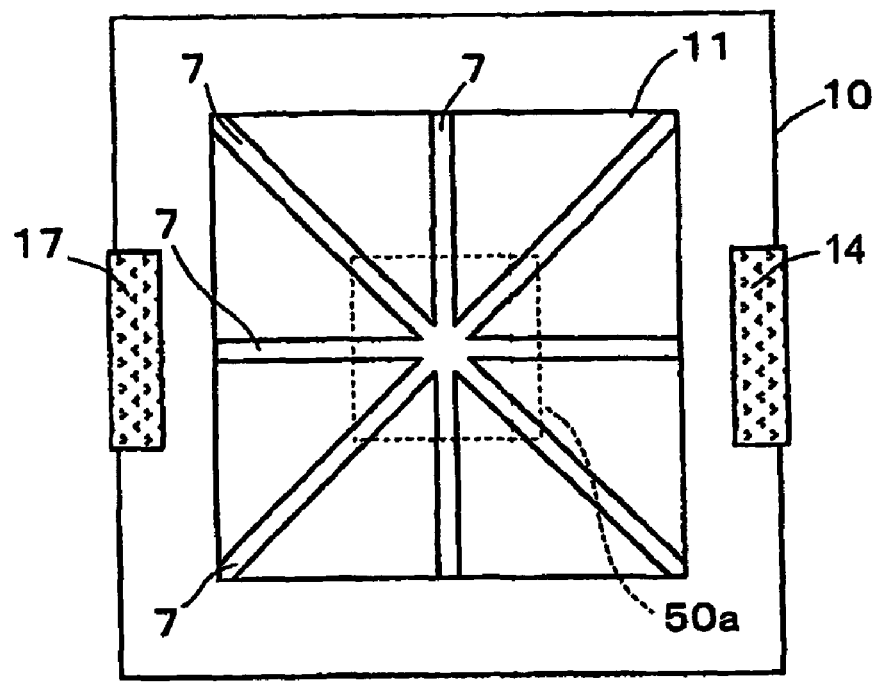
FIG. 33 is a bottom plan view of a submount for LED of a light-emitting device of a further embodiment of the invention.

FIG. 33 shows a submount of a further embodiment of the invention having a groove structure. Grooves 7 are provided to extend radially from the center of the protrusion 11 of the mount base 10. Though only one LED chip (not shown) is mounted in this example above an area 50a at the center of the protrusion 11, a plurality of LED chips may be mounted. When a plurality of LED chips are mounted, they may be mounted radially from the optical viewpoint. In such a case, when the above-mentioned radial grooves 7 are formed, the thickness of the mount base 10 just below the central LED chip among them can be decreased. Then, heat transfer from the LED chips to the metallic plate is improved, and the temperature of the LED chips can be lowered on the average.

Figure 34:
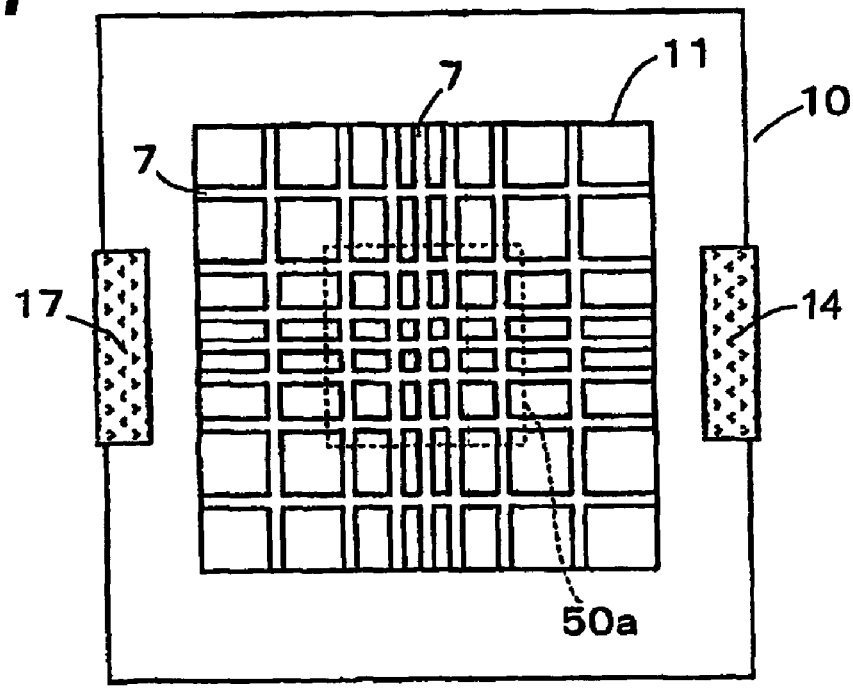
FIG. 34 is a bottom plan view of a submount for LED of a light-emitting device of a further embodiment of the invention.

FIG. 34 shows a submount of a further embodiment of the invention having a groove structure. Grooves 7 are formed densely in some areas and coarsely in other areas at the bottom of the mount base 10. Especially, the grooves 7 are formed densely at the central area so that the thickness of the mount base 10 just below the LED chip can be decreased, and heat transfer from the LED chips to the pattern plate is improved.

Figure 35A:
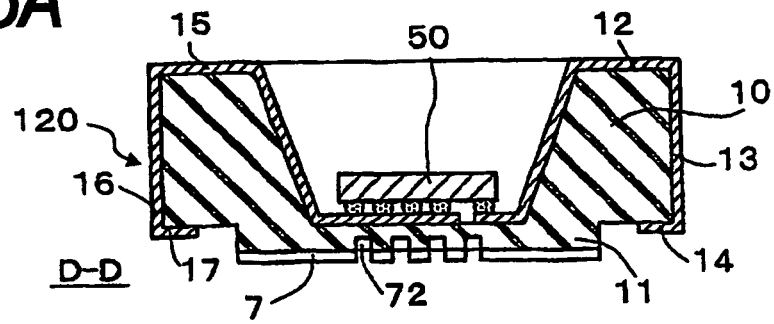
FIG. 35A is a sectional view of a submount for LED of a light-emitting device of a further embodiment of the invention.
Figure 35B:
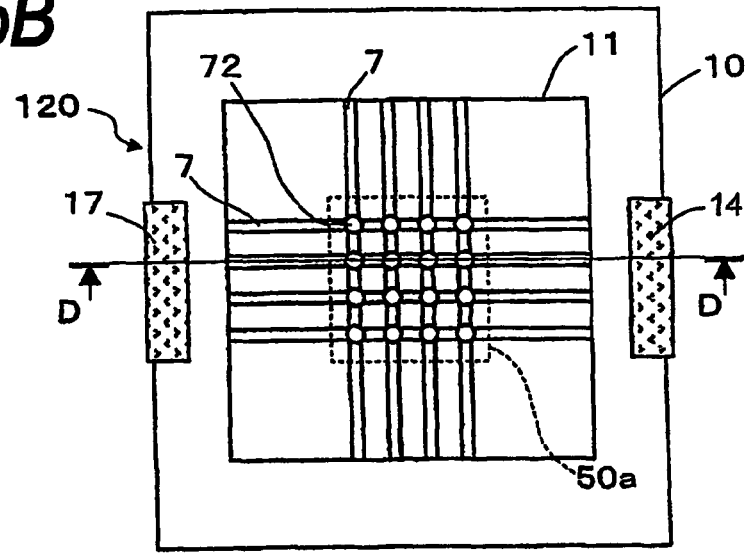
FIG. 35B is a bottom plan view of the submount for LED.

FIGS. 35A and 35B show a submount 120 of a further embodiment of the invention having a groove structure. Deep wells 72 are formed on the bottom of the mount base 10 in an area 50a just below the bonding members for the LED chip 50, and grooves 7 are formed vertically and transversely through the wells 72. Solder is filled into the grooves 7 and the wells 72 between the bottom of the mount base 10 and the metallic plate of the pattern plate (not shown). The numbers of the grooves 7 and the wells 72 and the positional relationship thereof are not limited to the example shown in FIGS. 35A and 35B. Because deep wells 72 are formed in the above-mentioned structure below the LED chip for the main heat transfer path for the LED chip, the thickness of the mount base 10 just below the LED chip can be decreased. Then, heat transfer from the LED chip to the metallic plate is improved, and the temperature of the LED chip can be lowered.

Figure 36:
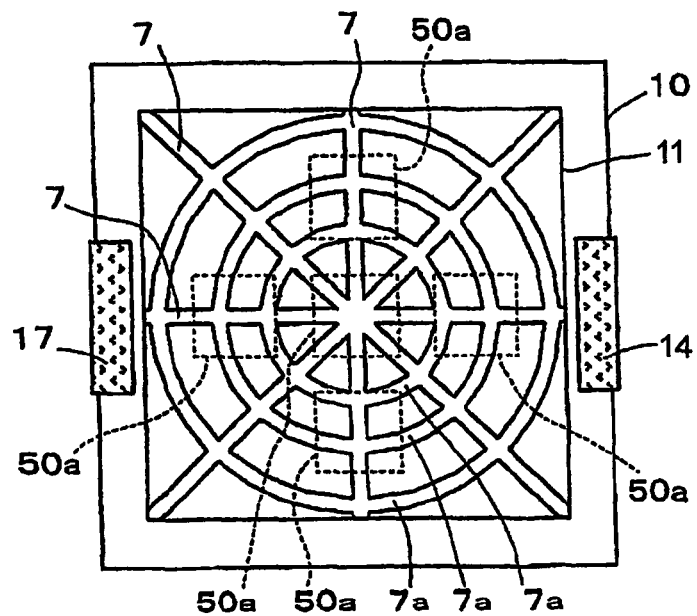
FIG. 36 is a bottom plan view of a submount for LED of a light-emitting device of a further embodiment of the invention.

FIG. 36 shows a submount of a further embodiment of the invention having a groove structure. Grooves 7 extend radially from a center of the protrusion 11 of the mount base 10, and the other grooves 7a are formed concentrically on the protrusion 11. When a plurality of LED chips are mounted, they may be mounted radially from the optical viewpoint. In this example, the above-mentioned grooves 7, 7a are formed radially around each of the LED chips to be mounted above areas 50a. Then, the thickness of the mount base 10 just below LED chip(s) can be decreased. Then, heat transfer from the LED chip(s) to the circuit board is improved, and the temperature of the LED chip(s) can be lowered.

Figure 37:
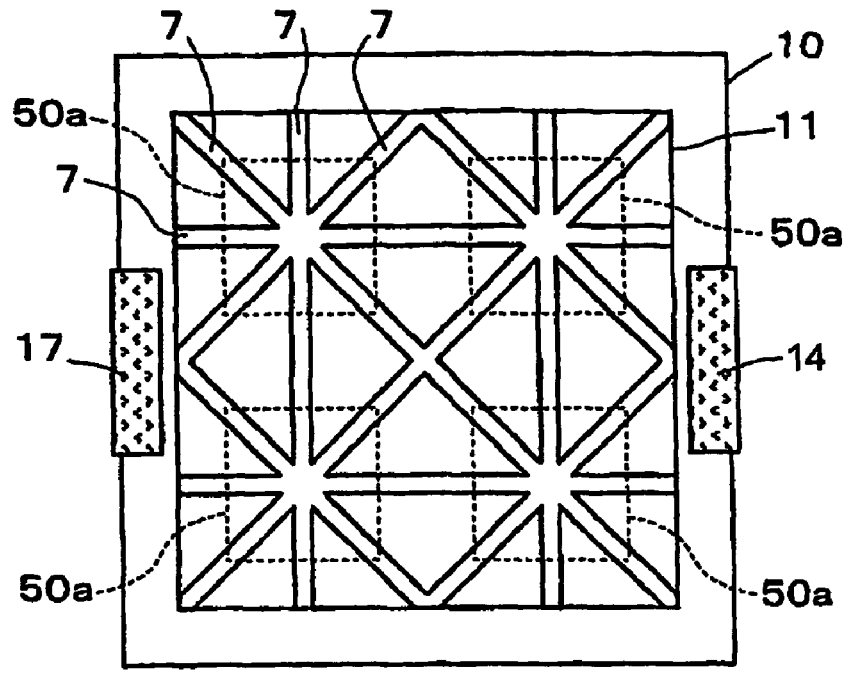
FIG. 37 is a bottom plan view of a submount for LED of a light-emitting device of a further embodiment of the invention.

FIG. 37 shows a submount of a further embodiment of the invention having a groove structure. Grooves 7 are formed radially around each of the LED chips to be mounted above areas 50a. Then, when a plurality of LED chips are mounted, the thickness of the mount base 10 just below LED chips can be decreased. Then, heat transfer from the LED chips to the circuit board is improved, and the temperature of the LED chips can be lowered.

Figure 38:
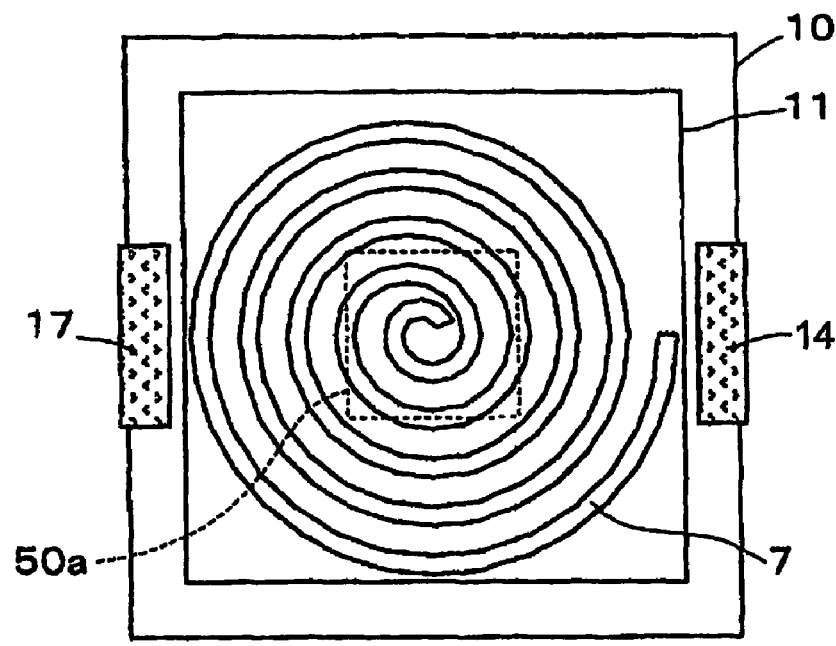
FIG. 38 is a bottom plan view of a submount for LED of a light-emitting device of a further embodiment of the invention.
Figure 39:
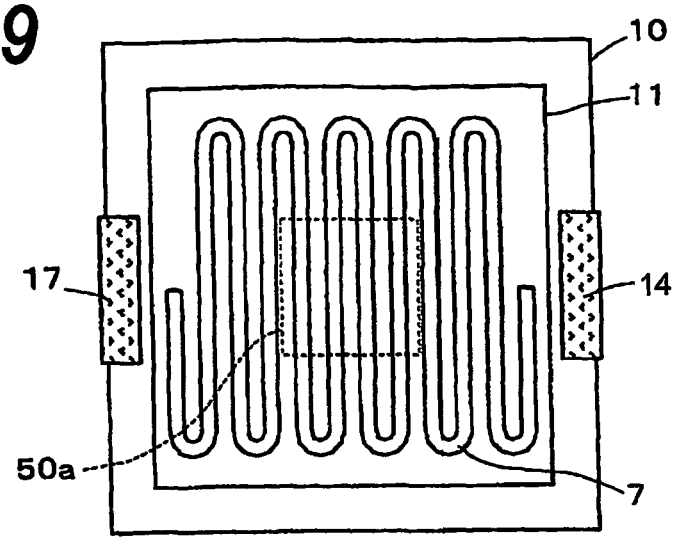
FIG. 39 is a bottom plan view of a submount for LED of a light-emitting device of a further embodiment of the invention.

FIGS. 38 and 39 show submounts of further embodiments of the invention having a groove structure. In the submount shown in FIG. 38, one spiral groove 7 is formed on the protrusion 11 on the bottom of the mount base 10, while in the submount shown in FIG. 39, one groove 7 is formed serpentinely on the protrusion 11 on the bottom of the mount base 10. When the submount is mounted on a metallic plate of the circuit board (not shown), a solder layer for bonding is interposed between the submount and the metallic plate.

In the groove shown in FIG. 38 or 39, a soldered metallic wire such as a soldered copper wire may be inserted therein as an auxiliary material for facilitating heat transfer. A metallic wire or a copper wire has a higher thermal conductivity than the mount base 10 and than the solder. Therefore, by inserting the wire, the heat resistance can be decreased more. Because only one groove 7 is formed on the bottom of the protrusion 11 of the mount base 10, it is easy to insert the wire in the groove 7.

Figure 40A:
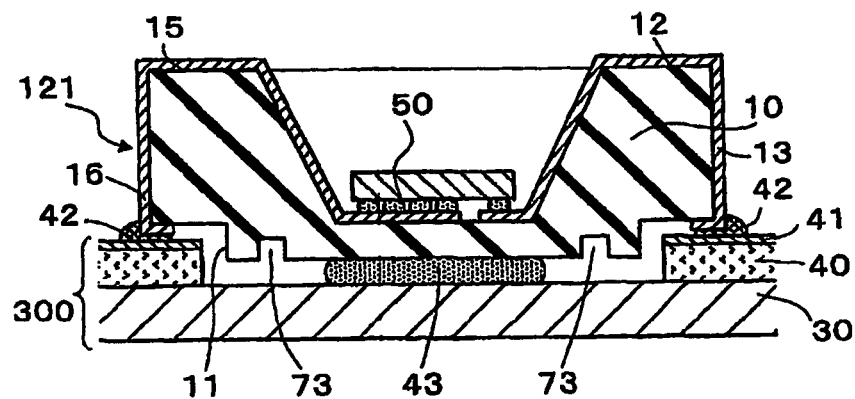
FIG. 40A is a sectional view of a light-emitting device of a further embodiment of the invention.
Figure 40B:
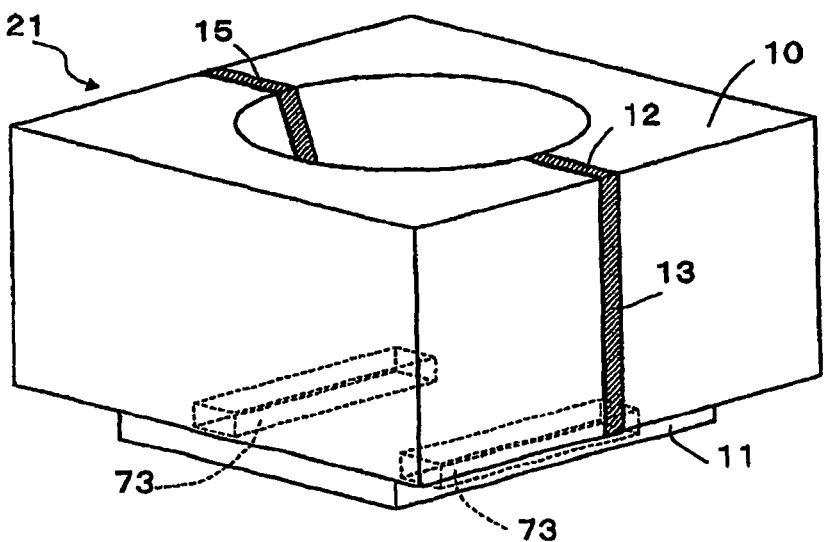
FIG. 40B is a perspective view of a submount for LED of the light-emitting device.

FIGS. 40A and 40B show a submount 121 of a further embodiment of the invention having a groove structure. Two recesses (grooves) 73 are formed in parallel at the bottom of the mount base 10 outside an area just below the LED chip 50. A solder layer 43 for bonding is interposed between the mount base 10 and the metallic plate 30 of the circuit board 300. In this structure having the recesses 73, a length along the surface of the mount base 10 from the thermal contact (the solder layer 43) to an electrical contact (solder 42) between the electrically conducting line and the pattern 41 of the circuit board 300 becomes longer, so that electrical short-circuit between them can be suppressed.

Figure 41A:
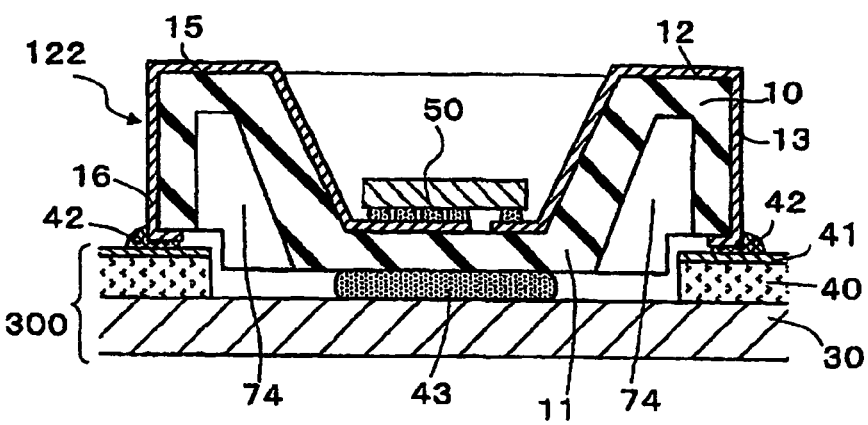
FIG. 41A is a sectional view of a light-emitting device of a further embodiment of the invention.
Figure 41B:
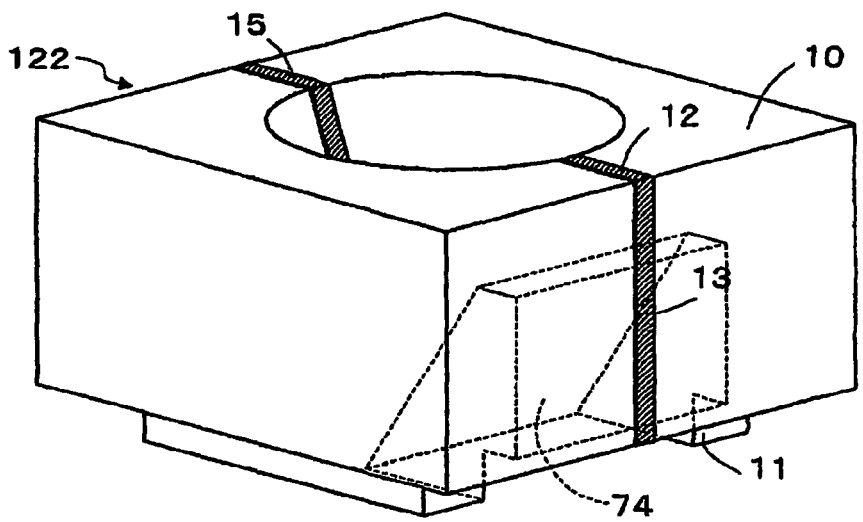
FIG. 41B is a perspective view of a submount for LED of the light-emitting device.

FIGS. 41A and 41B show a submount 122 of a further embodiment of the invention having a groove structure. Recesses 74 are formed similarly to, but having a larger size than the recesses 73 shown in FIGS. 40A and 40B. As shown in FIG. 41A, the recesses 74 have a bottom plane and two side planes extending between the bottom plane and the opening of the recess 74, and the width of the recess becomes wider towards the opening thereof.

In the structure having the recesses 74, similarly to the submount shown in FIG. 40A and 40B, a length along the surface of the mount base 10 from the thermal contact (the solder layer 43) to the electrical contact (solder 42) between the electrically conducting line and the metallic pattern 41 of the circuit board 300 becomes longer, so that electrical short-circuit between them can be suppressed. Further, an area for heat transfer is widened, and the heat transfer is improved. Further, the mount base 10 shown in FIGS. 41A and 41B can be fabricated easily with injection molding as a three-dimensional circuit board because the difference of the thickness of the mount base 10 is not so large, and the amount of a material for injection molding can be reduced.

Figure 42:
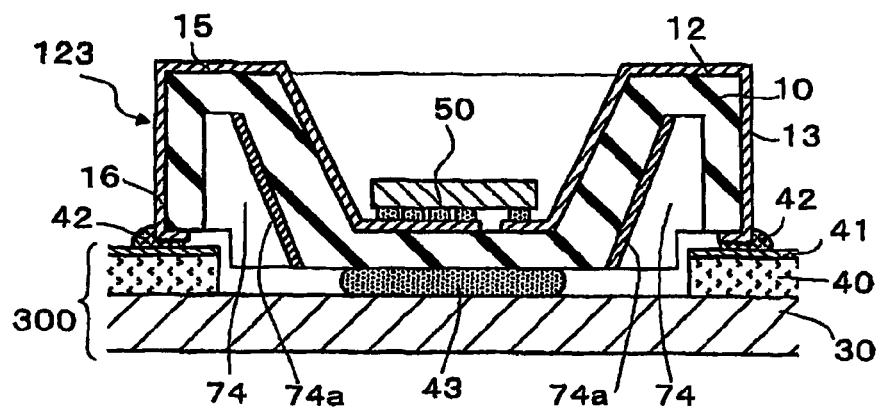
FIG. 42 is a sectional view of a light-emitting device of a further embodiment of the invention.

FIG. 42 shows a submount 123 of a further embodiment of the invention having a groove structure. The mount base 10 has recesses (grooves) 74 similar to those shown in FIGS. 41A and 41B and a metallic layer 74a is formed on a side plate in the recess. The metallic layer 74a may be formed with plating with silver or other metal such as copper or nickel. Alternatively, a white paint may be applied. Then, besides the above-mentioned advantages on the submount shown in FIGS. 41A and 41B, it is advantageous that the metallic layer 74a can reflect a part or all of light emitted by the LED chip 50 and transmitting the mounting layer 10. Thus, stray light in lateral directions can be taken out to the top plane, so that the efficiency of using the emitted light can be increased.

Figure 43:
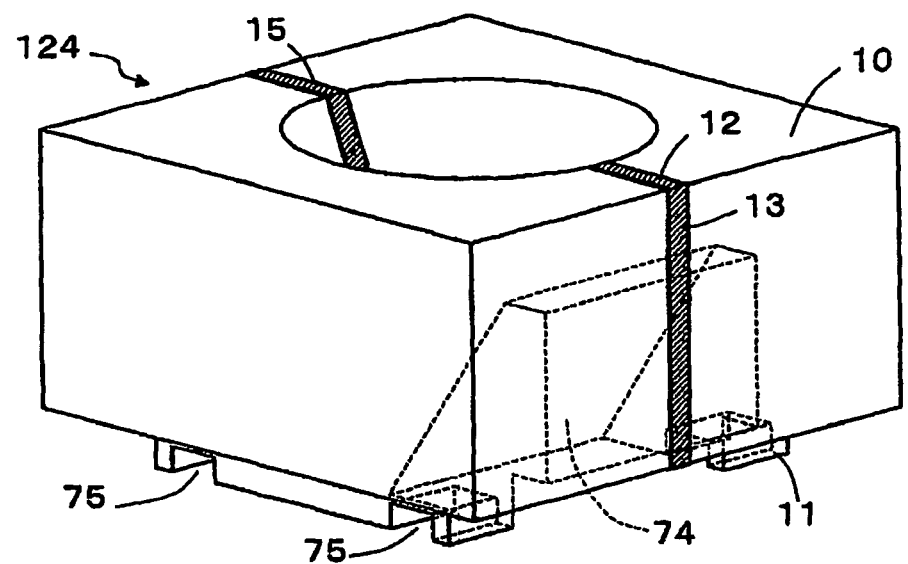
FIG. 43 is a perspective view of a submount for LED of a light-emitting device of a further embodiment of the invention.

FIG. 43 shows a submount 124 of a further embodiment of the invention having a groove structure. The mount base 10 has recesses 74 similar to those shown in FIGS. 41A and 41B. Further, air vents 75 are formed on the bottom of the mount base 10 from the inside of the recesses 74 to the side plane of the mount base 10 in a lateral direction. Then, heat transfer can be improved further due to the air vents 75 in the lateral direction.

Figure 44:
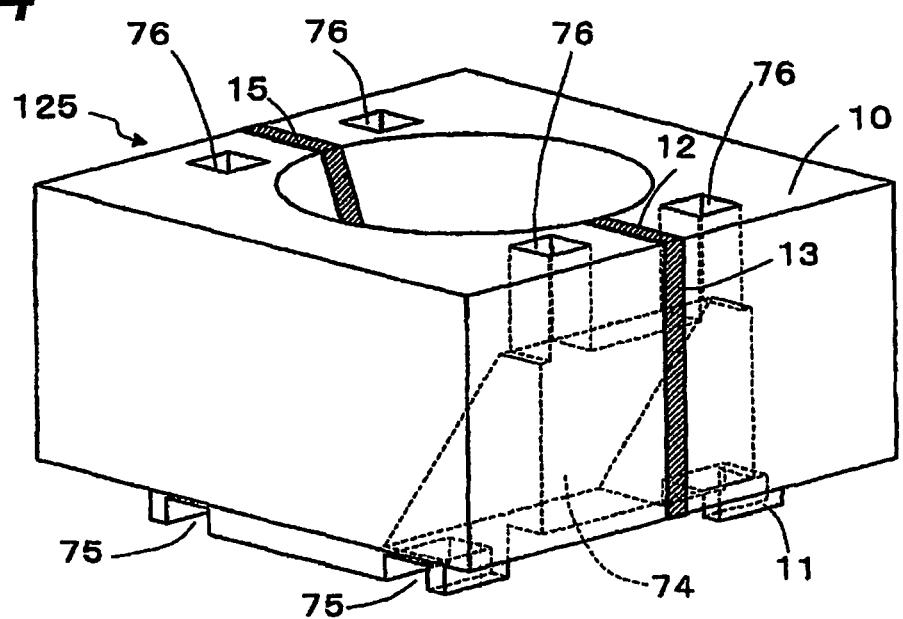
FIG. 44 is a perspective view of a submount for LED of a light-emitting device of a further embodiment of the invention.

FIG. 44 shows a submount 125 of a further embodiment of the invention having a groove structure. The mount base 10 has recesses 74 and air vents 75 similar to those shown in FIG. 43. Further, air vents 76 are formed from the inside of the recesses 74 to the top of the mount base 10 in the vertical direction. Then, heat transfer can be improved further due to the air vents in the vertical direction.

The above-mentioned embodiments can be modified in various ways. For example, the LED chip and the mount base in the submount are not limited to wire bonding, face down mounting and the like. In the above-mentioned embodiments, the mount base is made of alumina, but it may also be made of a ceramic other than alumina or a resin. The filler for the grooves is not limited to solder, and a material such as silver paste or silicone resin may also be used having a higher thermal conductivity than the mount base. Further, the number of the grooves and that of the LED chips are also not limited to the examples shown in the above-mentioned embodiments.

In the embodiments to be explained below, an additional path for heat transfer is added besides the thermal contact between the submount and the circuit board in order to improve the heat transfer efficiency further. Then the injection current for LED chips can be increased further.

Figure 45:
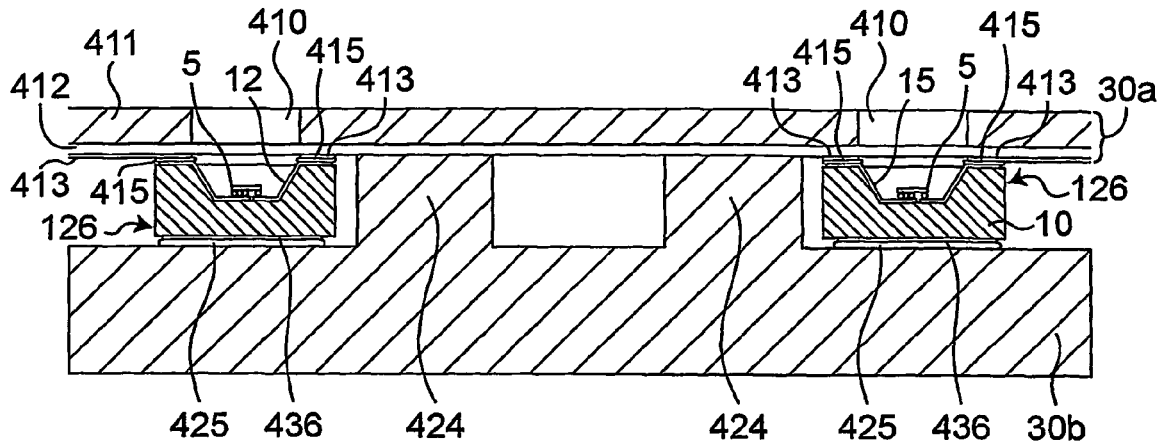
FIG. 45 is a sectional view of a light-emitting device of a further embodiment of the invention.
Figure 46A:
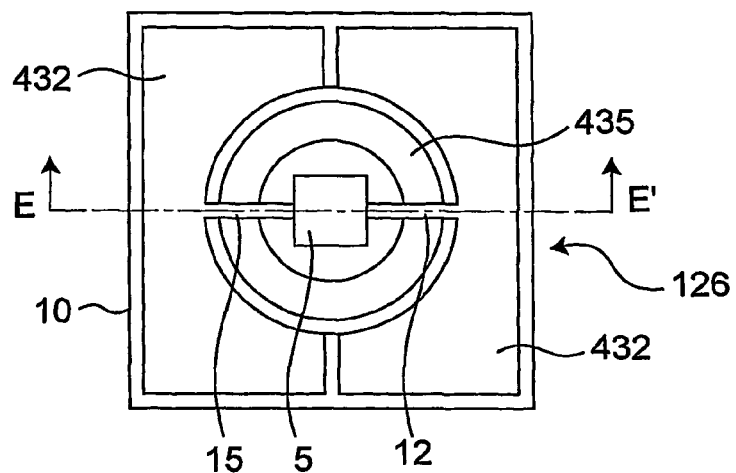
FIG. 46A is a front view of a submount for LED of the light-emitting device shown in FIG. 45.
Figure 46B:
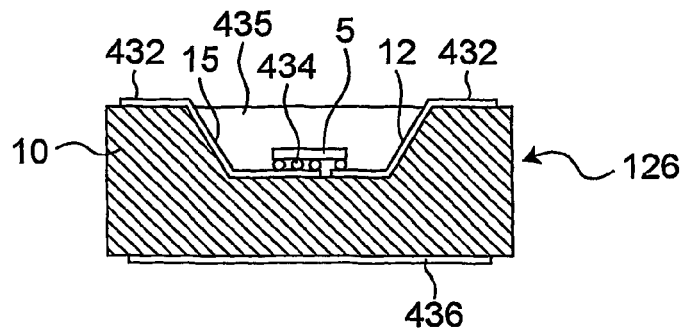
FIG. 46B is a sectional view thereof along E-E' line.

FIG. 45 shows a light-emitting device according to a further embodiment of the invention, and FIGS. 46A and 46B show a structure of a submount 126 used for the light-emitting device shown in FIG. 45. The light-emitting device shown in FIG. 45 has one or more submounts 126 interposed between a first plate 30a and a second plate 30b both provided for heat transfer. As shown in FIGS. 46A and 46B, the submount 126 has a mount base 10 having electrically conducting lines 12, 15 and an LED chip 5 mounted on the mount base 10. The mount base 10 has a recess 435 on the top thereof, and two electrically conducting lines 12, 15 are formed in the recess 435 and on the top plane of the mount base 10. The shape of the mount base 10 is not limited to that shown in FIGS. 46A and 46B. For example, it may have a flat top plane. The LED chip 5 is connected to the electrically conducting lines 12, 15 at the bottom of the recess 435 with bonding materials 434 between them, as shown in FIG. 46B, and the submounts 126 are mounted in the light-emitting device as shown in FIG. 45.

The first plate 30a is a circuit board, mentioned above, having a metallic plate 411, an insulator layer 412 and a metallic pattern 413 formed on the insulator layer 412. Two ends of the electrically conducting line 12, 15 on the top plane of the mount base 10 are used as lands 432 for electrical connection as the positive and negative terminals. The lands 432 of the submount 126 and the patterns 413 of the first plate 30a are bonded with solder 415. A portion of the plate 30a opposing to the LED chip 5 has an opening 410 in correspondence to the recess. A device for converting wavelength of incident light such as a fluorescent material may be set in the opening.

The second plate 30b is made of a metallic plate. A land 436 isolated electrically is formed for soldering on the bottom (rear) plane of the mount base 10, and it is bonded with solder 425 to the second plate 30b. The second plate 30b has thermal conduction portions 424 having planes opposing to the first plate 30a. The thermal conduction portions 424 of the second plate 30b contact with the first plate 30a or, preferably, are bonded thereto with soldering. The thermal conduction portions 424 may be provided as separate members to be bonded with the first and second plates 30a and 30b with solder or the like, or may be parts of the first or second plate 30a, 30b. Further, the thermal conduction portions 424 may contact with or be bonded to sides of the submounts 126.

In the structure shown in FIG. 45, heat dissipated in the mount base 10 is radiated through the second plate 30b, besides through the first plate 30a as in the previous embodiments. Therefore, the temperature of the LED chip 5 can be decreased further than the light-emitting device shown in FIG. 2. If the mount base 10 is made of a ceramic material such as aluminum nitride having good thermal conductivity, the heat can be conducted more efficiently, and the temperature of the ELD chip 5 can be decreased more.

In the structure shown in FIG. 45, two plates 30a, 30b used for heat transfer are mounted above and below the submount(s) 126, but the setting of the plates 30a and 30b are not limited to this example.

If the mount base 10 is for example a molded-interconnect-device (MID) plate, there is no limitation on the extension of the electrically conducting lines. Therefore, the two plates for heat transfer can be set at appropriate positions according to the requirements on the space where the light-emitting device is used, for example, on two planes or on a rear plane and a side plane. This also applies to following embodiments explained below.

Further, the number of the plates for heat transfer is not limited to two. In the example shown in FIG. 45, third and fourth plates for heat transfer may be set further at two sides of the submounts 126. This improves heat transfer further, and the chip temperature is decreased further.

Figure 47:
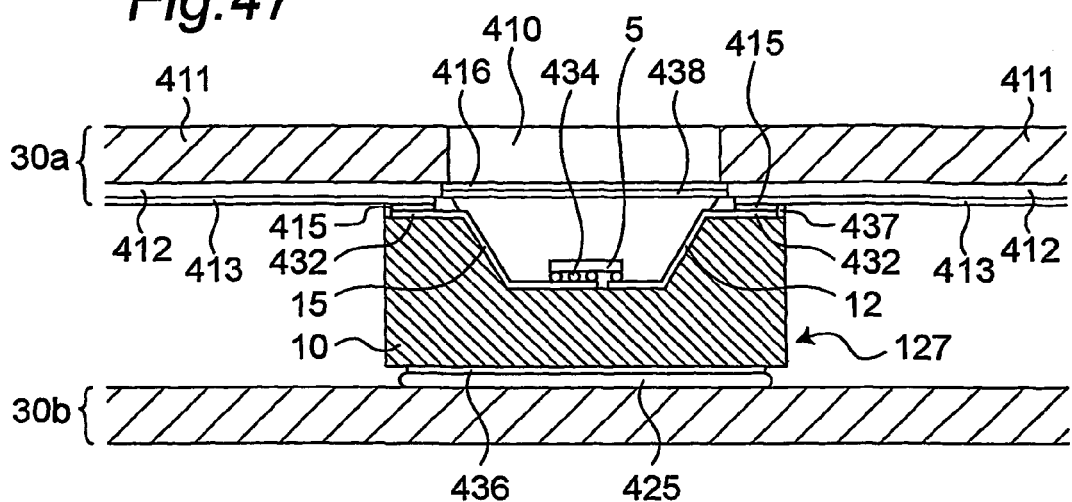
FIG. 47 is a sectional view of a light-emitting device of a further embodiment of the invention.
Figure 48:
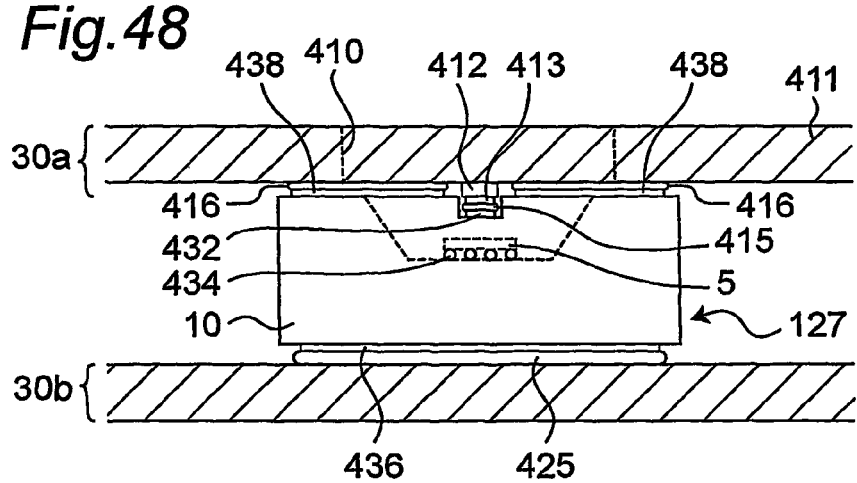
FIG. 48 is a sectional view of the light-emitting device shown in FIG. 47 observed from the right side.

FIG. 47 shows a light-emitting device according to a further embodiment of the invention, and FIG. 48 shows a section of the light-emitting device observed in the right side in FIG. 47. Further, FIGS. 49A, 49B and 50A, 50B show structures of a submount 127 and a first plate 30a for heat transfer of the light-emitting device shown in FIG. 47, respectively.

Figure 49A:
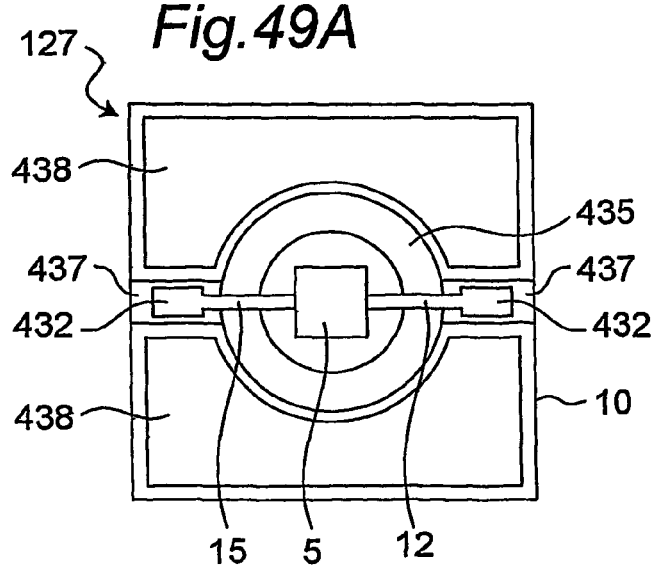
FIG. 49A is a front view of a submount for LED for the light-emitting device shown in FIG. 47.
Figure 49B:
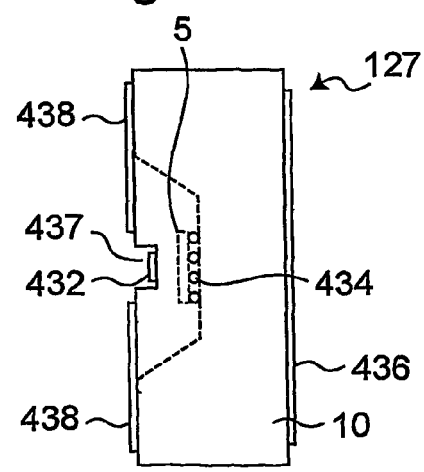
FIG. 49B is a right side view thereof.
Figure 50A:
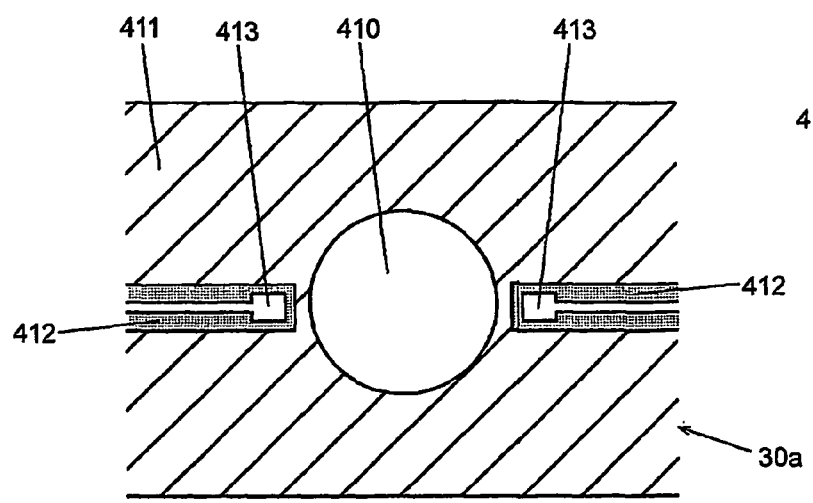
FIG. 50A is a diagram of a first plate for heat transfer for the light-emitting device shown in FIG. 47.
Figure 50B:
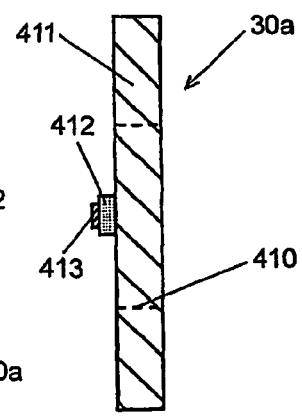
FIG. 50B is a right side view thereof.

The light-emitting device of this embodiment is similar to that shown in FIGS. 45 and 46 except following points. As shown in FIGS. 50A and 50B, a portion of the metallic plate 411 of the first plate 30a is exposed by removing a part of the insulator layer 412 or no electric conduction pattern is formed thereon, so as to make the metallic plate 411 contact with the top of the mount base 10. As shown in FIGS. 49A and 49B, a groove 437 is formed on the top of the mounting plane 10, and lands 432 to be extended to the electrically conducting line 12, 15 are formed in the groove 437. The portion of the first plate 30a on which the pattern 413 is formed so as to fit to the groove 437 on the top plane of the mount base 10. The lands 432 are bonded with solder to the pattern 413 on the first plate 30a. The first plate 30a is bonded with solder 416 to a pattern 438 formed at the top of the mount base 10.

Similarly to the previous embodiment, a portion of the plate 30a opposing to the LED chip 5 has an opening 410. Further, if the second plate 30b is a metallic plate having a higher thermal conductivity than the circuit board, the heat diffused in the mount base 10 made of a ceramic material can be diffused further, and the temperature of the LED chip 5 can be lowered further.

Because the metallic plates in the plates for heat transfer are contacted or bonded with the submount 127, the heat transfer can be performed more efficiently, and the temperature of the LED chip 5 can be lowered further. Further, because the circuit boards are used for heat transfer, the degree of freedom on the electrical connection of the submount can be increased.

Figure 51:
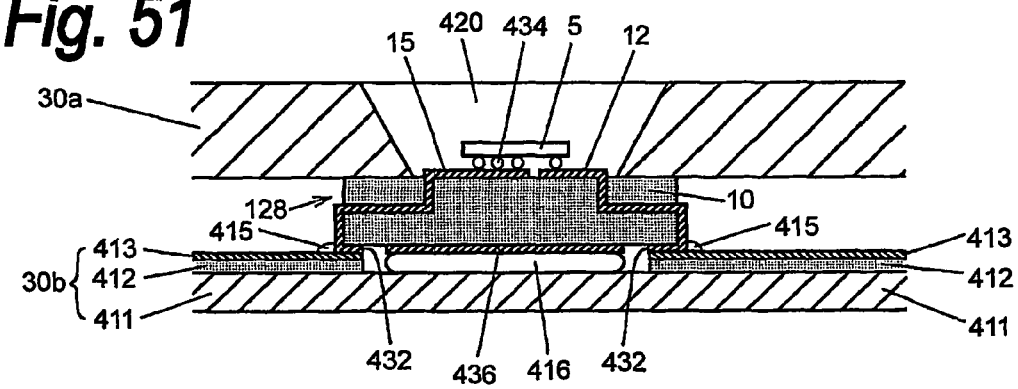
FIG. 51 is a sectional view of a light-emitting device of a further embodiment of the invention.
Figure 52A:
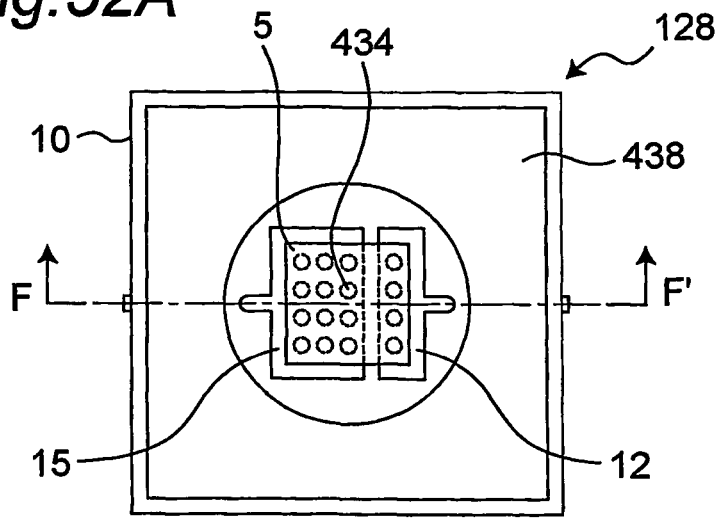
FIG. 52A is a front view of a submount for LED of the light-emitting device shown in FIG. 51.
Figure 52B:
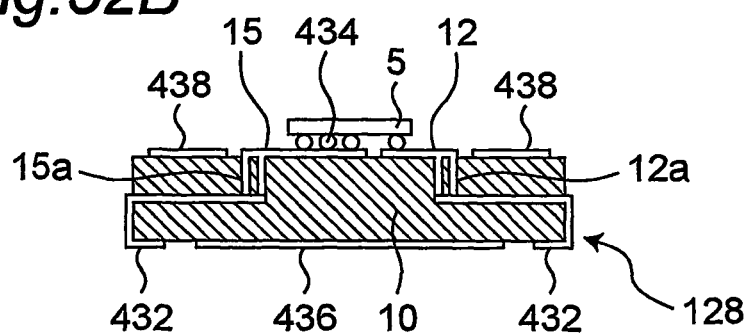
FIG. 52B is a sectional view thereof along F-F' line.

FIG. 51 shows a light-emitting device according to a further embodiment of the invention, and FIGS. 52A and 52B show a submount 128 of the light-emitting device. The mount base 10 of the submount 128 has a multi-layer structure made of flat plates and has electrically conducting lines 12 and 15. However, the shape of the mount base 10 is not limited to be the flat plane, and it may be a plate having a recess or the like. A shown in FIG. 52B, the electrically conducting lines 12 and 15 extend from the top of the mount base 10 through through-holes 12a, 15a to an inner layer and further to an side plane thereof and to a part of the bottom of the mount base 10. A land 436 is formed for soldering at the bottom of the mount base 10 is formed at the bottom of the submount 128 and is bonded to the pattern 413 on the first plate 30a, but isolated electrically. An LED chip 5 is mounted with a bonding material 434 on the electrically conducting lines 21, 15 of the mount base 10.

The first plate 30a has a metallic plate 411, an insulator layer 412 and a metallic pattern 413 formed on the insulator layer 412. A portion of the metallic plate 411 of the first plate 30a is exposed by removing a part of the insulator layer 412 on which no electric conduction pattern is formed, so as to make the metallic plate contact with the top plane of the mount base 10. The first plate 30a is bonded with solder 416 to the land 436 at the bottom plane of the mount base 10. Further, the land at an end of the pattern 413 of the first plate 30a is connected with solder 415 to the land 432 at an end of the pattern 413 of the mount base 10.

The second plate 30b for heat transfer is a metallic plate made of copper, and it is bonded to the top plane of the mount base 10 in this embodiment. The metallic plate is made of copper, but is not limited thereto. An opening 420 is provided in a portion of the second plate 30a opposing the LED chip 5. It is preferable that the side of the opening 420 is tapered, but not limited to the tapered shape. In this example, silver is deposited on the surface of the tapered portion, and the silver film is polished. If the mount base 10 is made of a ceramic material, it is preferable that a plane in contact with the second plate 30b is metallized, for example with tungsten, and the metallized portion for heat transfer may be bonded directly without soldering to the second plate 30b.

In this embodiment, too, the heat diffused in the mount base 10 made of a ceramic material having high thermal conductivity is led through the metallic plate having high thermal conductivity, so that the temperature of the LED chip 5 can be lowered further. Further, because the pattern 413 can be formed at both sides of the first plate 30a opposing the submount 128, and the second plate usually fixed to an external device may not have a pattern. Then, it is advantageous that the design of electrical insulation has a high freedom.

Figure 53:
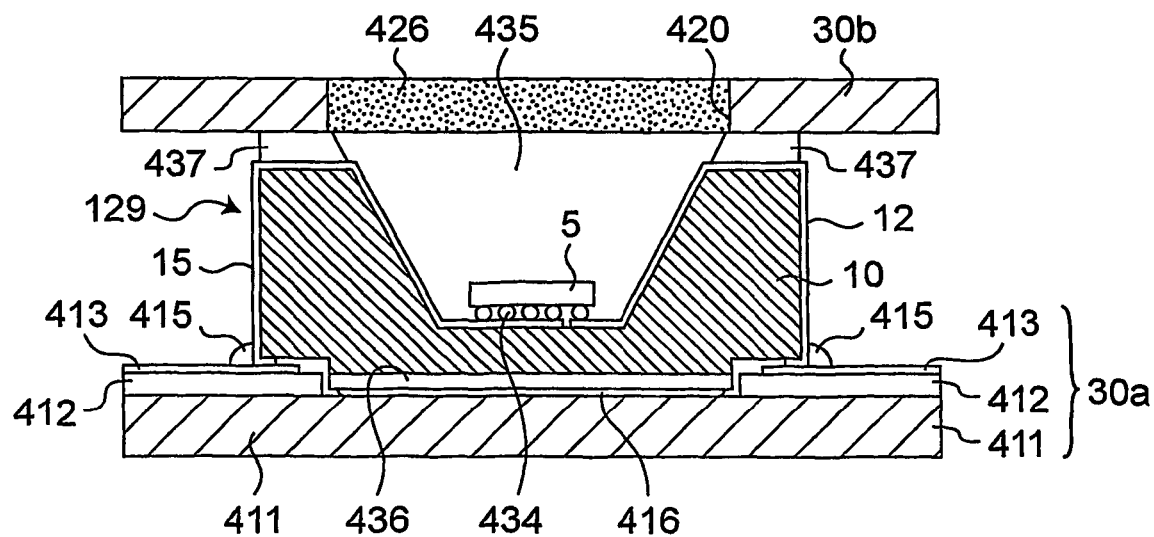
FIG. 53 is a sectional view of a light-emitting device of a further embodiment of the invention.
Figure 54A:
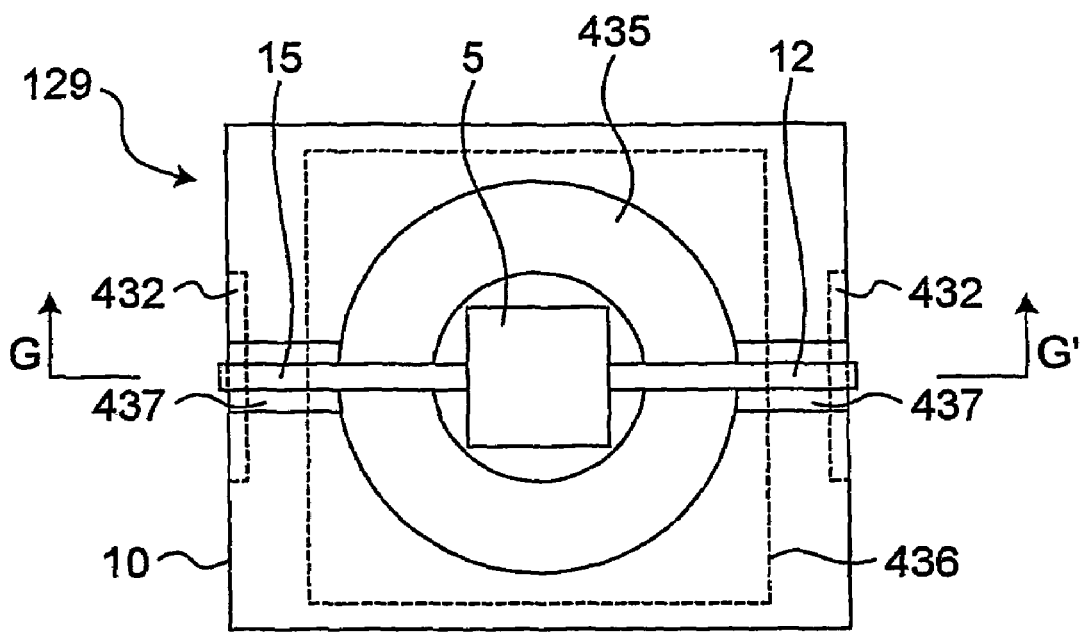
FIG. 54A is a front view of a submount for LED of the light-emitting device shown in FIG. 53.
Figure 54B:
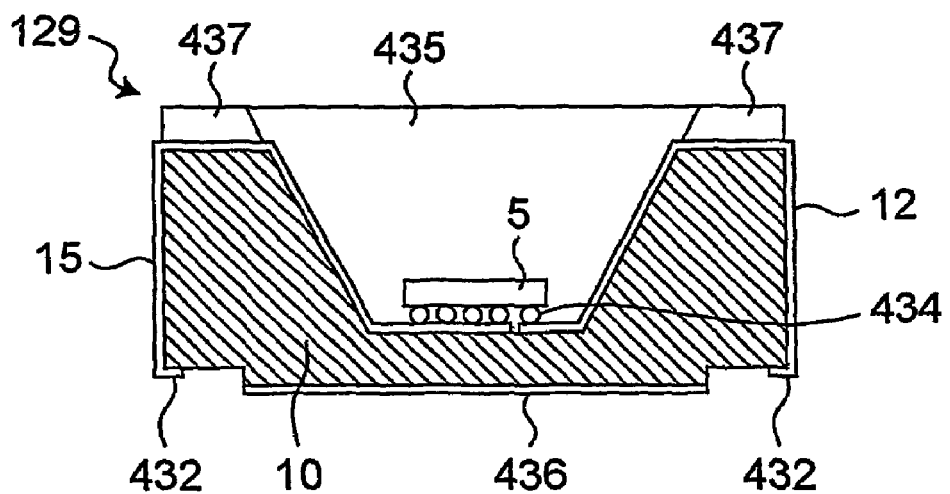
FIG. 54B is a sectional view thereof along G-G' line.

FIG. 53 show a light-emitting device according to a further embodiment of the invention, and FIGS. 54A and 54B show a submount 129 thereof. A circuit board 30a having a metallic plate 411, an insulator layer 412 and the pattern 413 is provided at the bottom plane of the submount 129. A recess 435 and a groove 437 are formed on the top of the submount 129, and electrically conducting line 12, 15 are formed on the bottom of the groove 437 and on the recess 435. Because the electrically conducting lines 12 and 15 formed on the submount 129 are formed in the groove 437, they do not contact with the second plate 30b. A metallic plate as the second plate 30b has an opening 420 of about the same size as the opening of the recess 435 on which the LED chip 5 is mounted. A cover 426 made of a transparent material or a material such as a fluorescent material converting the wavelength of incident light emitted by the LED chip 5 can be set in the opening 420 of the second plate 30b, or it can be used as a member for setting the fluorescent material.

In this embodiment, the heat generated in the LED chip 5 is conducted through the mount base 10 of the submount 129 to the second plate 30b and is radiated from the surface of the second plate 30b. Because the heat is also radiated from the second plate 30b, the heat transfer of the submount 129 is improved, and the temperature of the LED chip 5 is decreased. Therefore, the light-emitting device has a longer life. Further, because a larger current can be flown, the light intensity can be increased. Because the second plate is also used as a member for holding the fluorescent cover, the fabrication cost therefor can be decreased.

Figure 55:
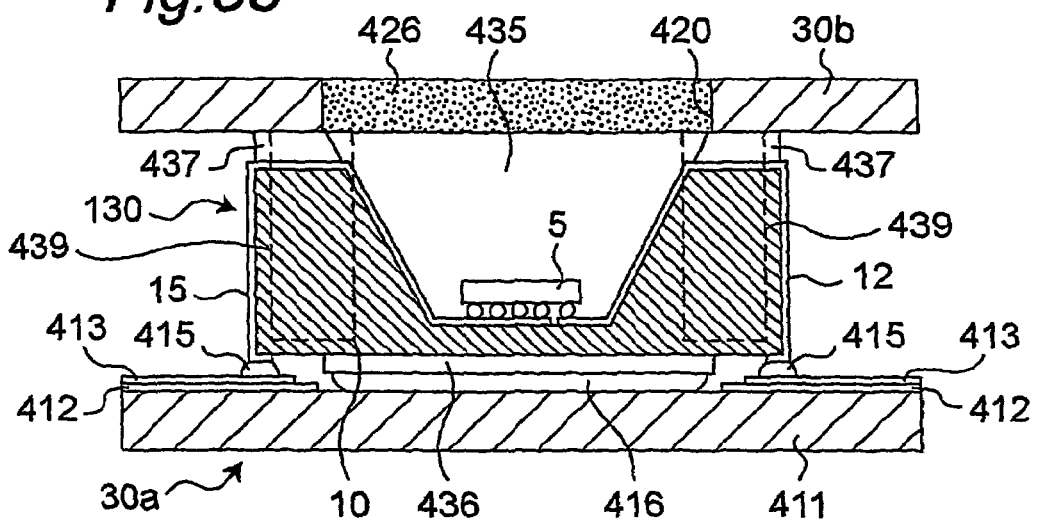
FIG. 55 is a sectional view of a light-emitting device of a further embodiment of the invention.
Figure 56A:
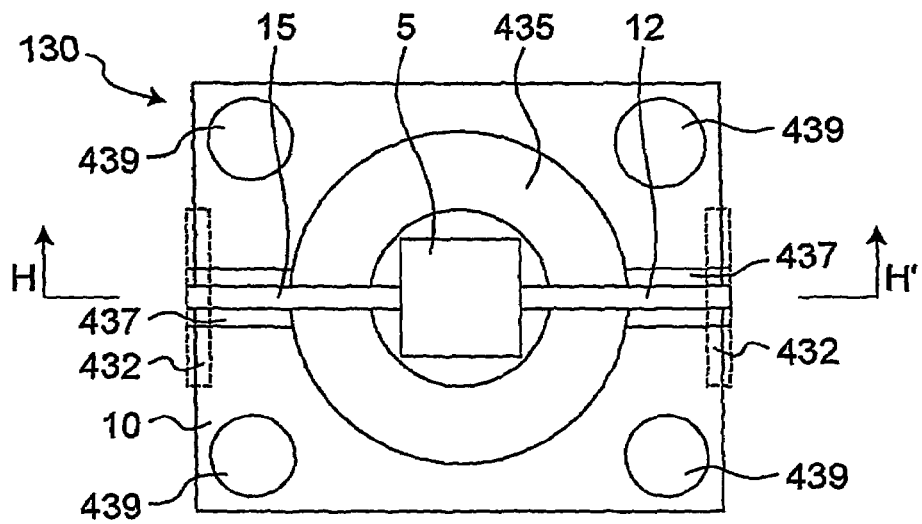
FIG. 56A is a front view of a submount for LED of the light-emitting device shown in FIG. 55.
Figure 56B:
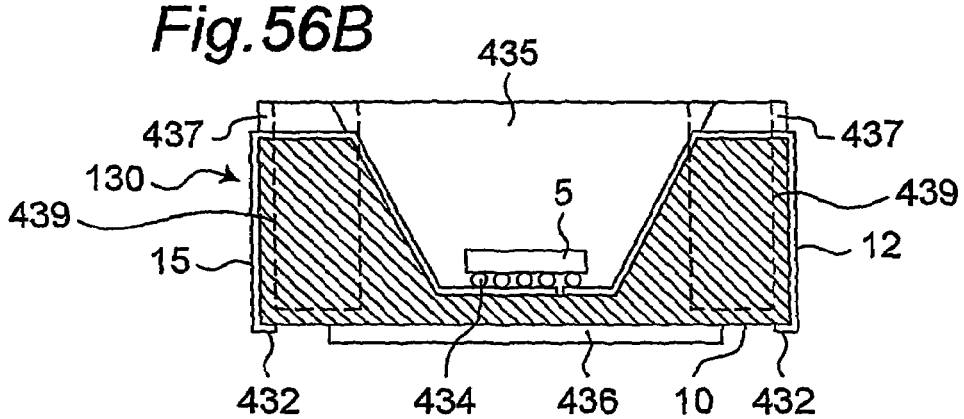
FIG. 56B is a sectional view thereof along H-H' line.

FIGS. 55 and 56A, 56B show a light-emitting device according to a further embodiment of the invention. A mount base 10 of a submount 130 is made of a resin or a ceramic, and a plurality of thermal vias 439 made of a metal such as copper, solder or gold having a good thermal conductivity are formed in the mount base 10. The thermal vias 439 do not contact with or is insulated electrically from the electrically conducting line 12, 15 formed on the submount 130. The top planes of the thermal vias 439 are exposed at the top plane of the submount 130. A recess 435 and a groove 437 are formed on the top of the submount 130, and electrically conducting lines 12, 15 are formed on the bottom thereof. A metallic plate used as the second plate 30b is set on a top plane of the submount 130 opposing to the top of the circuit board used as the first plate 30a.

The second plate 30b has an opening 420 having about the same size as the opening of the recess 435 on which the LED chip 5 is mounted. The second plate 30b of the mount base 10 is bonded with solder to the thermal vias 439 formed in the mount base 10. A cover 426 made of a transparent material or a material such as a fluorescent material converting the wavelength of the incident light emitted by the LED chip 5 can be set in the opening 420 of the second plate 30b, or it can be used as a member for setting the fluorescent material.

Because the electrically conducting lines 12 and 15 are formed in the groove 437, they do not contact with the second plate 30b. The thermal via 439 may be fabricated by forming a hole from above the top plane of the submount 130, by plating gold at the side of the hole and by filling solder therein.

Because the thermal vias are positioned near the LED chip 5 than the side plane of the submount 130, the heat generated by the LED chip 5 is likely to conduct through the thermal vias 439 than the side plane of the submount 130. Thus, the heat is conducted from the mount base 10 of the submount through the thermal vias 439 to the second plate 30b to be radiated from the surface thereof.

As explained above, according to the embodiment, because the heat is also radiated from the second plate for heat transfer, the heat transfer of the submount is improved, and the temperature of the LED chip is decreased. Therefore, the light-emitting device has a longer life. Further, because a larger current can be flown, the light intensity can be increased. Because the second plate is also used as a member for holding the fluorescent cover, the fabrication cost can be decreased.

Figure 57A:
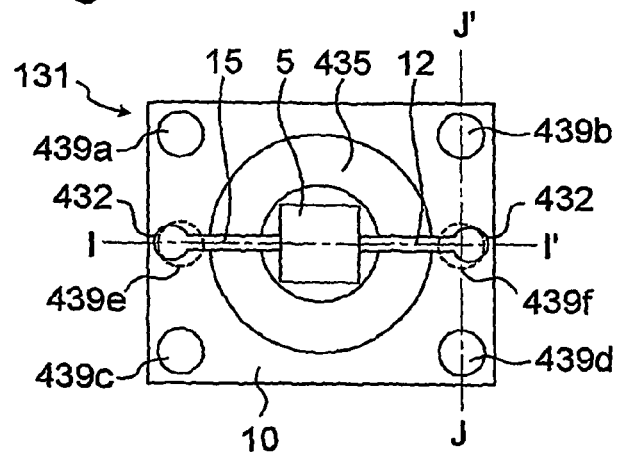
FIG. 57A is a front view of a submount for LED of a light-emitting device according to an embodiment of the invention.
Figure 57B:
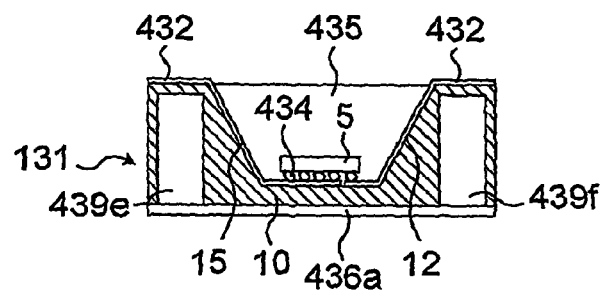
FIG. 57B is a sectional view thereof along I-I' line.
Figure 58A:
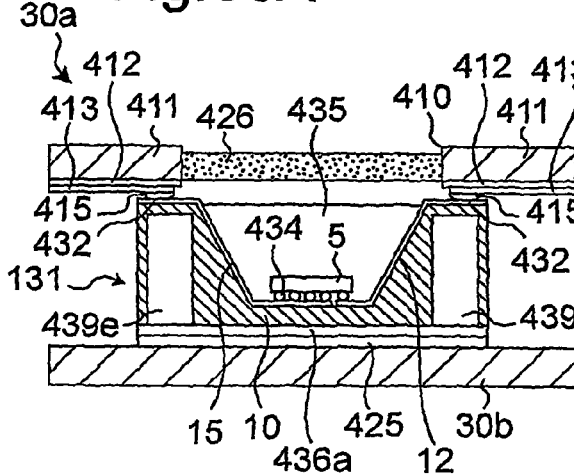
FIG. 58A is a sectional view of the light-emitting device with the submount for LED along I-I' line in FIG. 57A.
Figure 58B:
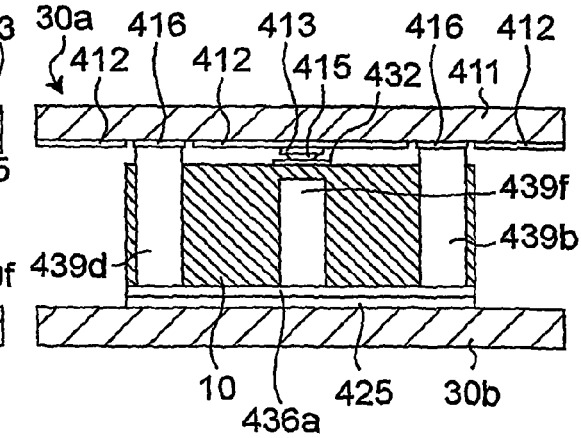
FIG. 58B is a further sectional view along J-J' line in FIG. 57B.

FIGS. 57A and 57B show a submount 131 and FIGS. 58A and 58B shows a light-emitting device with the submount 131 according to a further embodiment of the invention. A metallic panel 436a is provided on the generally whole bottom plane of the submount 131. Thermal vias 439a to 439f are embedded in the mount base 10, and the bottom planes thereof contact with the top of the metallic panel 436a. The bottom plane of the metallic panel 436a is bonded with solder 425 to a metallic plate used as the second plate 30b for heat transfer. Therefore, each of the thermal vias 439a to 439f is connected thermally to the second plate 30b closely. The bottom of the thermal vias 439a to 439f may be extended to the bottom plane of the second plane 30b. The tops of the thermal vias 439a to 439d embedded around the four corners of the mount base 10 are exposed at the top plane of the submount 131 without contacting with the electrically conducting lines 12, 15 and contacts with a metallic plate 411 of the first plate 30a. The electrically conducting lines 12, 15 formed on a recess 435 of the submount 131 are extended to the top plane of the mount base 10 and are connected to pads 432.

As shown in FIGS. 58A and 58B, the circuit board used as the first plate 30a has a metallic plate 411, an insulator layer 412 and a pattern layer 413, and the pattern of the pattern layer 413 faces the top of the submount 131. The pattern layer 413 is connected with solder 415 to the pads 432 connected to the electrically conducting lines 12, 15. The tops of the thermal vias 439a to 439d exposed at the top plane of the submount 131 are connected with solder to the metallic plate 411 of the first plate 30a. The metallic plate 411 is also used as a jig for setting a fluorescent cover 426.

In this embodiment, the second plate 30b for heat transfer and the submount 131 are connected to each other over a large area to facilitate head conduction through the main heat transfer path. When an LED is used for a light-emitting device or a display device, a plate at the bottom side of a submount is fixed generally to the main body of the device after an insulating processing. In the structure of this embodiment, this corresponds to the second plate 30b. Because it is insulated electrically from the LED chip 5, an insulating process is not needed, or the fabrication cost can be decreased. Further, the heat resistance between the second plate 30b and the main body of the device can be decreased, and the heat transfer can be performed efficiently.

Figure 59A:
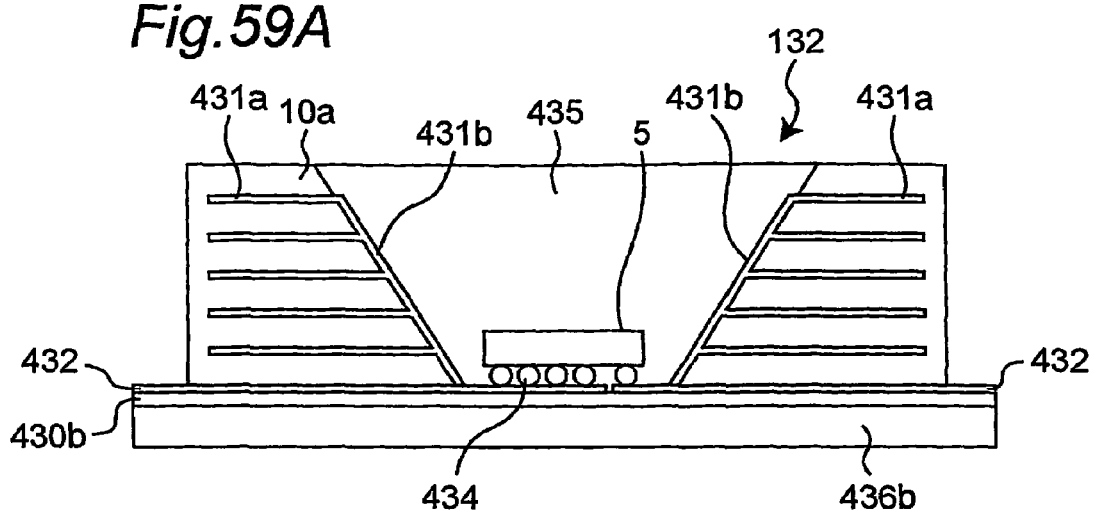
FIG. 59A is a sectional view of a submount for LED for a light-emitting device of a further embodiment of the invention.
Figure 59B:
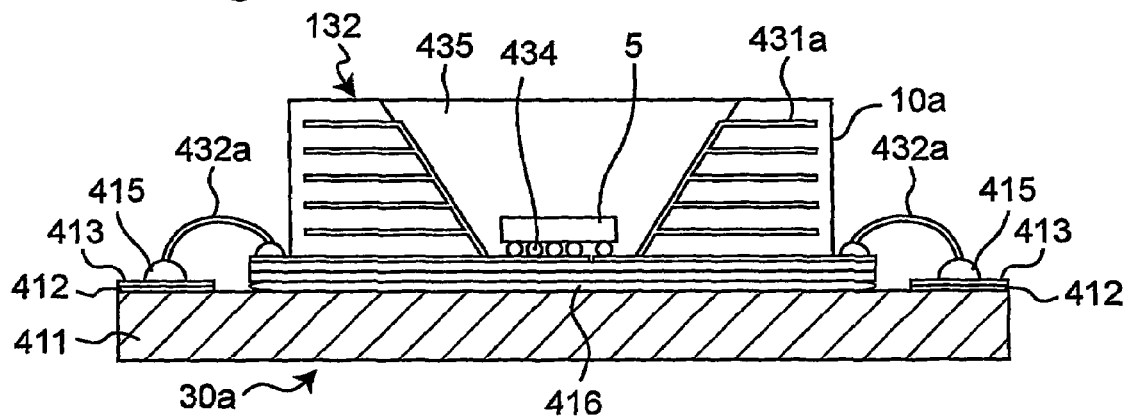
FIG. 59B is a sectional view in a state where it is mounted on a plate.
Figure 59C:
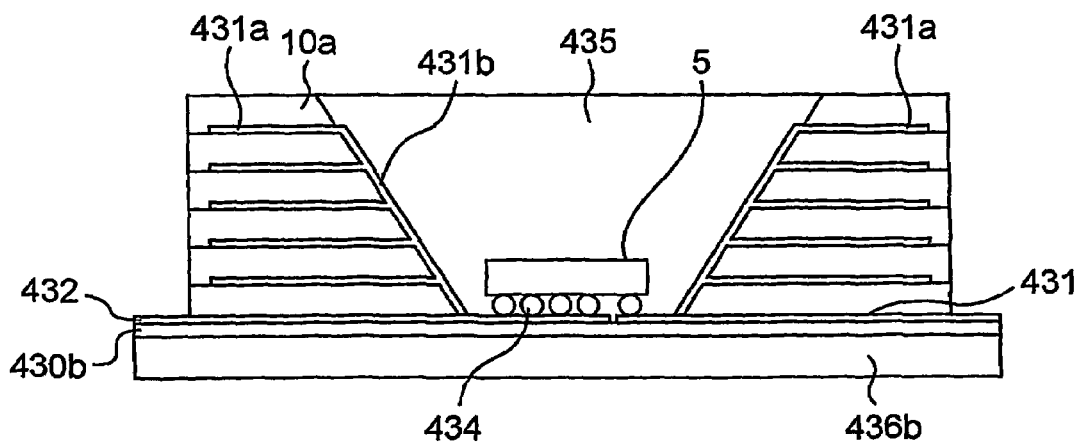
FIG. 59C is a sectional view for explaining a process for fabricating a multi-layer pattern for heat transfer.

FIGS. 59A, 59B and 59C show a light-emitting device according to a further embodiment of the invention. A plurality of layers of metallic foils 431a (for heat transfer) having high thermal conductivity are provided in a mount base 10a of a submount 132. It is not necessary that the metallic foils are arranged horizontally, but that they are arranged desirably with good balance for facilitating head conduction. They are not exposed to the outside of the submount 132. A metallic plate 436b has electrically conducting line 431 and an insulator layer 430b formed successively thereon, and they are arranged on the bottom plane of the submount 132. They extend to the lateral side to provide pads 432 at the top plane thereof. Electrically conducting lines 431b are formed on a recess 435 formed at the center of the top plane of the submount 132 to connect the metallic foils 431a and the electrically conducting line 431.

A part of the metallic plate 411 used as the first plate 30a for heat transfer, or the circuit board, is exposed, and the exposed part is bonded with solder 416 to the metallic plate 436b of the submount 132. The pads 432 are connected with wire bonding to the pattern 413 in the first plate 30b. The technique for electrical connection is not limited. In the example shown in FIGS. 59A to 59C, an end of a wire 432b is bonded, while the other end thereof is connected with solder 415 to the pattern 413.

The metallic foils 431a to be connected to p and n electrodes of the LED chip 5 and the metallic layer 431b at the sides of the recess 435 of the submount 132 are independent of each other, and they are not connected between the p and n sides. As shown in FIG. 59C, the patterns 431b may be formed by forming a pattern of the metallic foil 431a on a ceramic foil which has been formed to have a predetermined shape, by layering the metallic foils on the ceramic foils on the metallic plate 436b, and by curing it.

In this embodiment, the heat generated in the LED chip is conducted to the entire submount through the patterns for heat transfer, so that the heat transfer from the surface of the submount is accelerated. Because no pattern is present on the first plate for heat transfer opposing to the bottom plane of the submount, the contact area between them becomes wide, so that the heat transfer to the circuit board is enhanced, or the heat transfer through this path is increased.

In this embodiment, because the heat transfer to the first plate for heat transfer is enhanced and the heat transfer from the surface of the submount is also increased, the temperature of the LED chip can be lowered to give a longer life of the light-emitting device. Because a lager electrical current can be flown through the LED chip, the light intensity can be increased.

Figure 60A:
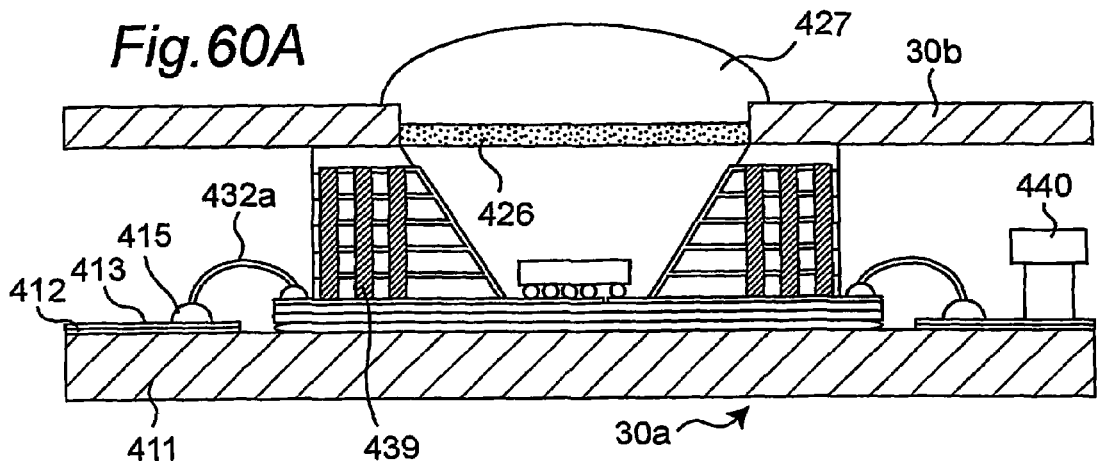
FIG. 60A is a sectional view of a light-emitting device having a lens for light control mounted on a pattern plate for heat transfer.
Figure 60B:
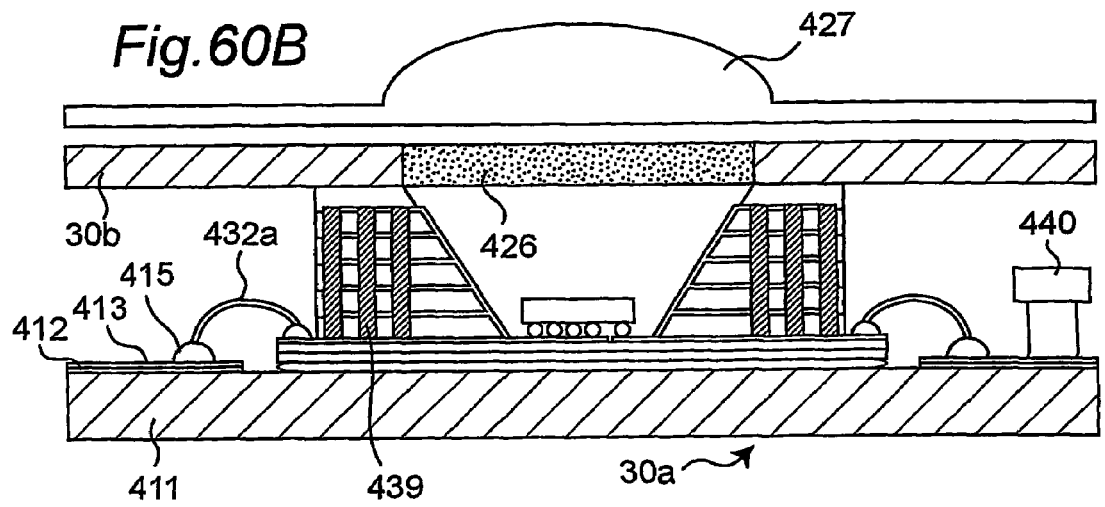
FIG. 60B is a sectional view of the lens light control provided separately from the pattern plate.

FIG. 60A shows a light-emitting device according to a further embodiment of the invention, wherein the submount has the structure shown in FIGS. 59A to 59C. A plate 30b provided on the top plane of the submount is also used as a frame for setting a fluorescent material 426 and a lens 427 for light control. Thermal vias 439 are formed through the foils 431a, but not exposed at the top of the submount. The tops of the thermal vias 439 have gold layers, and the frame 30b for fixing the lens is bonded with solder thereto. Alternatively, as shown in FIG. 60B, the top plate 30b may also be used only to set a fluorescent cover 426, while the lens 427 may be separated therefrom. The reference number 440 represents an electronics part.

Alternatively, the thermal vias 439 may be exposed at the top of the submount. In this case, the circuit board is set on the top plate, and the thermal vias as electrodes are connected to the circuit board or the first plate for heat transfer.

In the structures of this embodiment, the heat transfer to the submount becomes even through the thermal vias, and the heat transfer in the upper direction to the second plate for heat transfer is also accelerated A similar advantage is obtained by providing a metallic plate for heat transfer on the top of the submount, but the thermal vias can accelerate heat transfer more. According to this embodiment, heat transfer is accelerated more by using the patterns for heat transfer and the thermal vias. In this embodiment, the submount 133 is used, but the type thereof is not limited thereto.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A light-emitting device, comprising:
    a submount comprising a mount base made of an electrically insulating material, at least one light-emitting diode chip mounted thereon and electrically conducting lines formed on the mount base to be connected electrically to the light-emitting diode chip; and
    a first plate for heat transfer comprising a metallic plate,
    wherein a first plane of the mount base opposed to the metallic plate of the first plate is bonded thermally to said first plate,
    wherein the mount base comprises a recess, and the at least one light-emitting diode chip is mounted on a bottom of the recess,
    wherein at least one groove is provided on the first plane of the mount base, and
    wherein a number of said at least one groove is equal to or larger than two, the grooves have different depths, and depth of the grooves increases toward a region just below the light-emitting diode chip.

2. A light-emitting device, comprising:
    a submount comprising a mount base made of an electrically insulating material, at least one light-emitting diode chip mounted thereon and electrically conducting lines formed on the mount base to be connected electrically to the light-emitting diode chip; and
    a first plate for heat transfer comprising a metallic plate,
    wherein a first plane of the mount base opposed to the metallic plate of the first plate is bonded thermally to said first plate,
    wherein the mount base comprises a recess, and the at least one light-emitting diode chip is mounted on a bottom of the recess,
    wherein at least one groove is provided on the first plane of the mount base,
    wherein the light-emitting diode chip is mounted face down to the mount base with a bonding material, and said at least one groove is formed between the bonding material and the first plane of the mount base to bond thermally to the exposed portion of the metallic plate, and
    wherein a number of said at least one groove is equal to or larger than two, the grooves have different depths, and depth of the grooves increases toward a region just below the bonding material.

3. A light-emitting device, comprising:
    a submount comprising a mount base made of an electrically insulating material, at least one light-emitting diode chip mounted thereon and electrically conducting lines formed on the mount base to be connected electrically to the light-emitting diode chip; and
a first plate for heat transfer comprising a metallic plate,
wherein a first plane of the mount base opposed to the metallic plate of the first plate is bonded thermally to said first plate,
wherein the mount base comprises a recess, and the at least one light-emitting diode chip is mounted on a bottom of the recess,
wherein at least one groove is provided on the first plane of the mount base, and
wherein a number of the at least one light-emitting diode chip is equal to or larger than two, a number of said at least one groove is equal to or larger than two, the grooves have different depths, and said grooves have deeper depth in a region between a central light-emitting chip among the at least one light-emitting diode chip and the exposed portion of the metallic plate than in the other regions.

* * * * *

UNITED STATES PATENT AND TRADEMARK OFFICE
CERTIFICATE OF CORRECTION

PATENT NO. : 7,495,322 B2  Page 1 of 1
APPLICATION NO. : 10/558360
DATED : February 24, 2009
INVENTOR(S) : Hashimoto et al.

It is certified that error appears in the above-identified patent and that said Letters Patent is hereby corrected as shown below:

On the Title Pg. Item (56) under References Cited in the printed patent, "6,706,546 B2 3/2004 Inao et al." should be --6,706,546 B2 3/2004 Yoshimura et al.--.

Signed and Sealed this

Fifteenth Day of September, 2009

David J. Kappos
*Director of the United States Patent and Trademark Office*